(12) United States Patent
Ide et al.

(10) Patent No.: US 7,169,705 B2
(45) Date of Patent: Jan. 30, 2007

(54) PLATING METHOD AND PLATING APPARATUS

(75) Inventors: Kunihito Ide, Tokyo (JP); Koji Mishima, Tokyo (JP); Hiroyuki Kanda, Tokyo (JP); Hidenao Suzuki, Tokyo (JP); Kazufumi Nomura, Tokyo (JP)

(73) Assignee: Ebara Corporation, Tokyo (JP)

( * ) Notice: Subject to any disclaimer, the term of this patent is extended or adjusted under 35 U.S.C. 154(b) by 20 days.

(21) Appl. No.: 10/989,658

(22) Filed: Nov. 17, 2004

(65) Prior Publication Data

US 2005/0164498 A1 Jul. 28, 2005

(30) Foreign Application Priority Data

Nov. 19, 2003 (JP) ............................. 2003-389702

(51) Int. Cl.
*H01L 21/44* (2006.01)

(52) U.S. Cl. ................... 438/678; 438/638; 438/643; 438/653; 257/E21.174; 257/E21.175

(58) Field of Classification Search ..................... None
See application file for complete search history.

(56) References Cited

U.S. PATENT DOCUMENTS 6,113,771 A 9/2000 Landau et al.

6,350,366 B1 2/2002 Landau et al.
6,632,335 B2 10/2003 Kunisawa et al.

OTHER PUBLICATIONS

PCT WO 02/47139 A2, Fumio Kondo, Substrate Processing Method, Jun. 13, 2002.*

* cited by examiner

*Primary Examiner*—Michael Lebentritt
*Assistant Examiner*—Kyoung Lee
(74) *Attorney, Agent, or Firm*—Wenderoth, Lind & Ponack, L.L.P.

(57) ABSTRACT

A plating method is capable of depositing a plated film having excellent in-plane uniformity with respect to a thin seed layer and excellent embeddability with respect to fine damascene structures. The plating method includes: positioning an electric resistor between a conductive layer formed on at least a portion of a surface of a substrate and an anode; introducing respectively a plating solution into a space between the conductive layer and the anode on a conductive layer side, and an anode solution into a space between the conductive layer and the anode on an anode side, thereby filling the space with a plating bath composed of the plating solution and the anode solution, with the plating solution containing 25 to 75 g/L of copper ions and at least 0.4 mole/L of an organic acid or an inorganic acid, and the anode solution being of the same composition as the plating solution, or containing 0 to 75 g/L of copper ions and at most 0.6 mole/L of an organic acid or an inorganic acid; and applying a voltage between the conductive layer and the anode to plate a surface of the conductive layer.

12 Claims, 26 Drawing Sheets

PLATING METHOD AND PLATING APPARATUS

BACKGROUND OF THE INVENTION

1. Field of the Invention

The present invention relates to a plating method and a plating apparatus, and more particularly to a plating method and a plating apparatus used for filling a fine interconnect pattern formed in a substrate, such as a semiconductor wafer, with metal (interconnect material) such as copper so as to form interconnects.

2. Description of the Related Art

Recently, the so-called damascene process has been used in the art as a process of forming copper interconnects in semiconductor devices. According to the damascene process, fine interconnect recesses such as interconnect trenches in circuit patterns and via holes are formed in an insulating film (inter level dielectric film) laminated on a surface of a semiconductor wafer, and then filled with copper as an interconnect material. Thereafter, extra copper layer (plated film) is removed from the surface by a chemical mechanical polishing (CMP) process or the like to form circuits. It has been studied to use a low-k material having a small dielectric constant as material of the insulating film. For example, low-k/copper damascene interconnects for logic devices is an important technology for producing highly integrated high-performance multi-level interconnects.

The above interconnect forming process poses stringent requirements on copper-plated films. For example, 65 nm generation technology is required to have excellent embeddability with respect to finer damascene structures, excellent in-plane uniformity of a plated film thickness on 300 mm wafers, or reduced steps on a plated film surface. Difficulty will be experienced in satisfying these requirements because barrier and seed layers are expected to be much thinner in the 65 nm generation technology.

If seed layers are formed as thinner layers by conventional cup-type plating apparatus, then the seed layers themselves tend to have higher electric resistance. When a plated film is deposited on a surface of a wafer having such a thinner seed layer, a thickness of the plated film is progressively smaller from an edge of the wafer toward a center thereof. Therefore, in-plane uniformity of the plated film is lost. One solution would be to use an electric field adjustment component known as a shield plate or divided anodes for generating a uniform electric field. However, since components used or a process recipe is changed depending on a type of plating solution and thickness of the seed layer, this solution would require complex operational details if a wide variety of samples are to be fabricated.

According to another countermeasure, electric resistance between an anode and a conductive layer (wafer) may be increased to an extent that in-plane uniformity of a plated film becomes insusceptible to an electric resistance of the seed layer itself. Based on this concept, it has been proposed to lower concentration of sulfuric acid in a plating solution to a level of at most 20 g/L, for example, to increase the electric resistance of the plating solution itself (see U.S. Pat. No. 6,350,366), or to insert a special resistor between electrodes to increase electric resistance between the electrodes (see M. Tsujimura et al., "Novel Compact ECD Tool for ULSI Cu Metallization", Proc. ISSM, 2000, pp. 106–109).

However, if the concentration of the sulfuric acid in the plating solution is lowered to increase in-plane uniformity of a plated film, then a bottom-up growth of the plated film is reduced as the concentration of the sulfuric acid in the plating solution is lowered, thereby possibly causing a reduction in embeddability in a pattern of fine interconnects. In particular, the above problem manifests itself for interconnects having a width of at most 0.1 μm and via holes having a diameter of at most 0.1 μm, thereby failing to embed a plated film reliably in those interconnects and via holes. Other conventional processes have also suffered such difficulty in depositing plated films having both excellent in-plane uniformity and excellent embeddability.

SUMMARY OF THE INVENTION

The present invention has been made in view of the above drawbacks. It is therefore an object of the present invention to provide a plating method and a plating apparatus which are capable of depositing a plated film having excellent in-plane uniformity with respect to a thin seed layer and excellent embeddability with respect to fine damascene structures.

In order to achieve the above object, the present invention provides a method of plating a film on a substrate, comprising: positioning an electric resistor between a conductive layer formed on at least a portion of a surface of the substrate and an anode; introducing respectively a plating solution into a space between the conductive layer and the anode on a conductive layer side, and an anode solution into a space between the conductive layer and the anode on an anode side, thereby filling the space with a plating bath composed of the plating solution and the anode solution, with the plating solution containing 25 to 75 g/L of copper ions and at least 0.4 mole/L of an organic acid or an inorganic acid, and the anode solution being of the same composition as the plating solution, or containing 0 to 75 g/L of copper ions and at most 0.6 mole/L of an organic acid or an inorganic acid; and applying a voltage between the conductive layer and the anode to plate a surface of the conductive layer.

By plating a film using a plating solution having a high acid concentration in a plating bath that is brought into contact with the conductive layer and actually used to plate the film, this plated film has increased embeddability. At the same time, by inserting an electric resistor between the substrate and the anode, and plating a film using an anode solution having a low acid concentration in a plating bath that is brought into contact with the anode but not actually used to plate the film, electric conductivity of the plating bath as a whole is lowered to increase in-plane uniformity of a thickness of this plated film. Thus, a film having both increased in-plane uniformity of a thickness thereof and increased embeddability can be plated.

From a standpoint of embeddability, the acid concentration in the plating solution should generally be at least 0.4 mole/L, and should preferably be in the range from 0.4 to 1.0 mole/L and more preferably be in the range from 0.4 to 0.8 mole/L. From a standpoint of in-plane uniformity of the thickness of the plated film, the acid concentration in the anode solution should generally be at most 0.6 mole/L, and should preferably be in the range from 1.0 to 0.6 mole/L and more preferably be in the range from 1.0 to 0.2 mole/L.

It is preferred that the plating method further comprise measuring electric conductivity of the anode solution, and adding at least pure water, an organic acid, or an inorganic acid to the anode solution to keep the electric conductivity of the anode solution at a constant level of at most 200 mS/cm when a surface of the conductive layer starts being plated.

The electric conductivity of the anode solution is preferably managed in a range from 1 to 10 S/m, and more preferably is managed to be at most 3 S/m which is one-half the electric conductivity in a normal plating process.

Each of the plating solution and the anode solution comprises, for example, a solution containing sulfuric acid, alkanesulfonic acid, or alkanol sulfonic acid.

A source of copper ions of each of the plating solution and the anode solution comprises, for example, at least one copper compound selected from the group consisting of copper sulfate, copper oxide, copper chloride, copper carbonate, copper pyrophosphate, copper alkane sulfonic acid, copper alkanol sulfonic acid, and copper organic acid.

Each of the plating solution and the anode solution preferably comprises a solution including sulfuric acid and copper sulfate and containing at most 58 g/L of copper ions.

The plating bath made up of the plating solution and the anode solution preferably comprises a combination of a high-concentration sulfuric acid bath and a low-concentration sulfuric acid bath.

The anode solution is preferably managed using electric conductivity thereof.

The plating solution and the anode solution are preferably separated from each other by an ion exchanger.

If the ion exchanger is a material capable of selectively passing only univalent positive ions ($H^+$), then the plating bath made up of the plating solution and the anode solution remains electrically conductive, and the plating solution and the anode solution are prevented from being mixed with each other, so that the plating solution and the anode solution can individually be managed.

The present invention provides an apparatus for plating a film on a substrate, comprising: a substrate stage for holding a substrate; a cathode portion having a seal member for water-tightly sealing a peripheral portion of a surface, to be plated, of the substrate by contacting the peripheral portion of the surface, to be plated, of the substrate held by the substrate stage, and a cathode which is brought into contact with the substrate to supply current to the substrate; an electrode head vertically movably disposed above the cathode portion, and having an anode and an electric resistor with water retentivity at upper and lower parts of the electrode head; a plating solution inlet section for introducing a plating solution between the electric resistor and the surface, to be plated, of the substrate held by the substrate stage; an anode solution introducing section for introducing an anode solution between the anode and the electric resistor; and a power source for applying a plating voltage between the cathode and the anode.

A partition is preferably disposed between the electric resistor and the anode or between the electric resistor and the substrate held by the substrate stage.

The partition preferably comprises an ion exchanger.

Alternatively, the electric resistor may be partly or wholly combined with a function as an ion exchanger.

DETAILED DESCRIPTION OF THE PREFERRED EMBODIMENTS

An embodiment of the present invention will be described below with reference to the drawings. The following embodiment shows an example applied to a plating apparatus in which copper as an interconnect material is embedded in fine recesses for interconnects formed in a surface of a substrate, such as a semiconductor wafer, so as to form interconnects composed of a copper layer. However, it should be noted that the present invention may be applied to plating apparatuses having other uses.

Figure 1A:
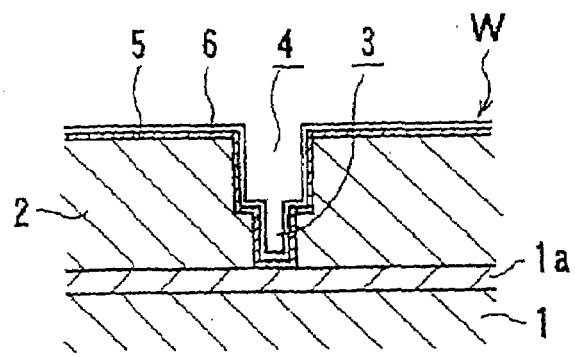
FIGS. 1A through 1D are views showing an example for forming interconnects in a semiconductor device in a sequence of steps.

FIGS. 1A through 1D illustrate an example of forming copper interconnects in a semiconductor device. As shown in FIG. 1A, an insulating film (interlevel dielectric film) 2, such as an oxide film of $SiO_2$ or a film of low-k material, is deposited on a conductive layer 1a on a semiconductor base 1 on which semiconductor devices are formed. Via holes 3 and interconnect trenches 4 are formed in the insulating film 2 by performing a lithography/etching technique so as to provide fine recesses for interconnects. Thereafter, a barrier layer 5 of TaN or the like is formed on the insulating film 2, and a seed layer 6 as an electric supply layer for electroplating is formed on the barrier layer 5 by sputtering or the like.

Figure 1B:
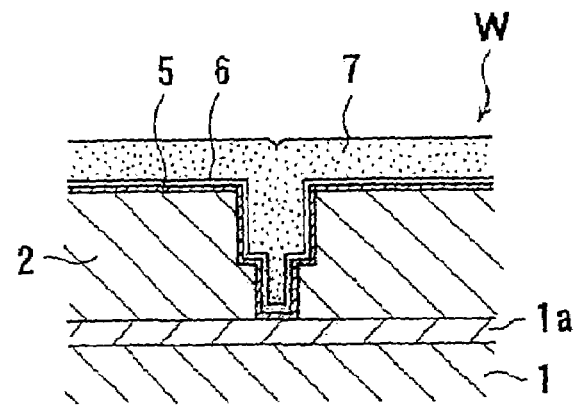
Figure 1C:
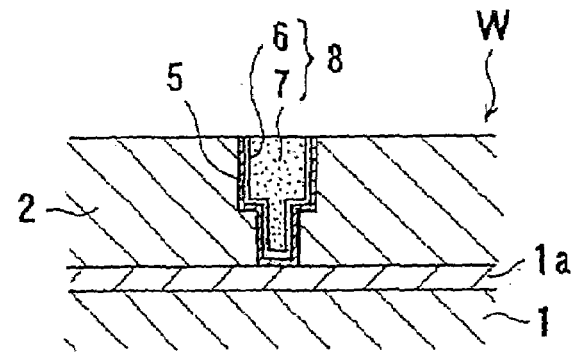

Then, as shown in FIG. 1B, copper plating is performed on a surface of a substrate W to fill the via holes 3 and the interconnect trenches 4 with copper and, at the same time, deposit a copper layer 7 on the insulating film 2. Thereafter, the barrier layer 5, the seed layer 6 and the copper layer 7 on the insulating film 2 are removed by chemical mechanical polishing (CMP) or the like so as to leave copper filled in the via holes 3 and the interconnect trenches 4, and have a surface of the insulating film 2 lie substantially on the same plane as this copper. In this manner, interconnects (copper interconnects) 8 composed of the seed layer 6 and the copper layer 7 are formed in the insulating film 2, as shown in FIG. 1C.

Figure 1D:
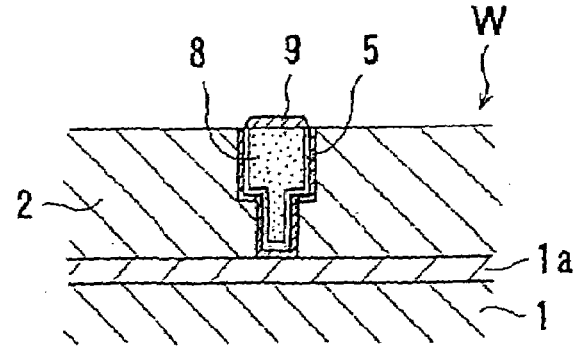

Then, as shown in FIG. 1D, electroless plating is performed on a surface of the substrate W to selectively form a protective film 9 of a Co alloy, an Ni alloy, or the like on surfaces of the interconnects 8, thereby covering and protecting exposed surfaces of the interconnects 8 with the protective film 9.

Figure 2:
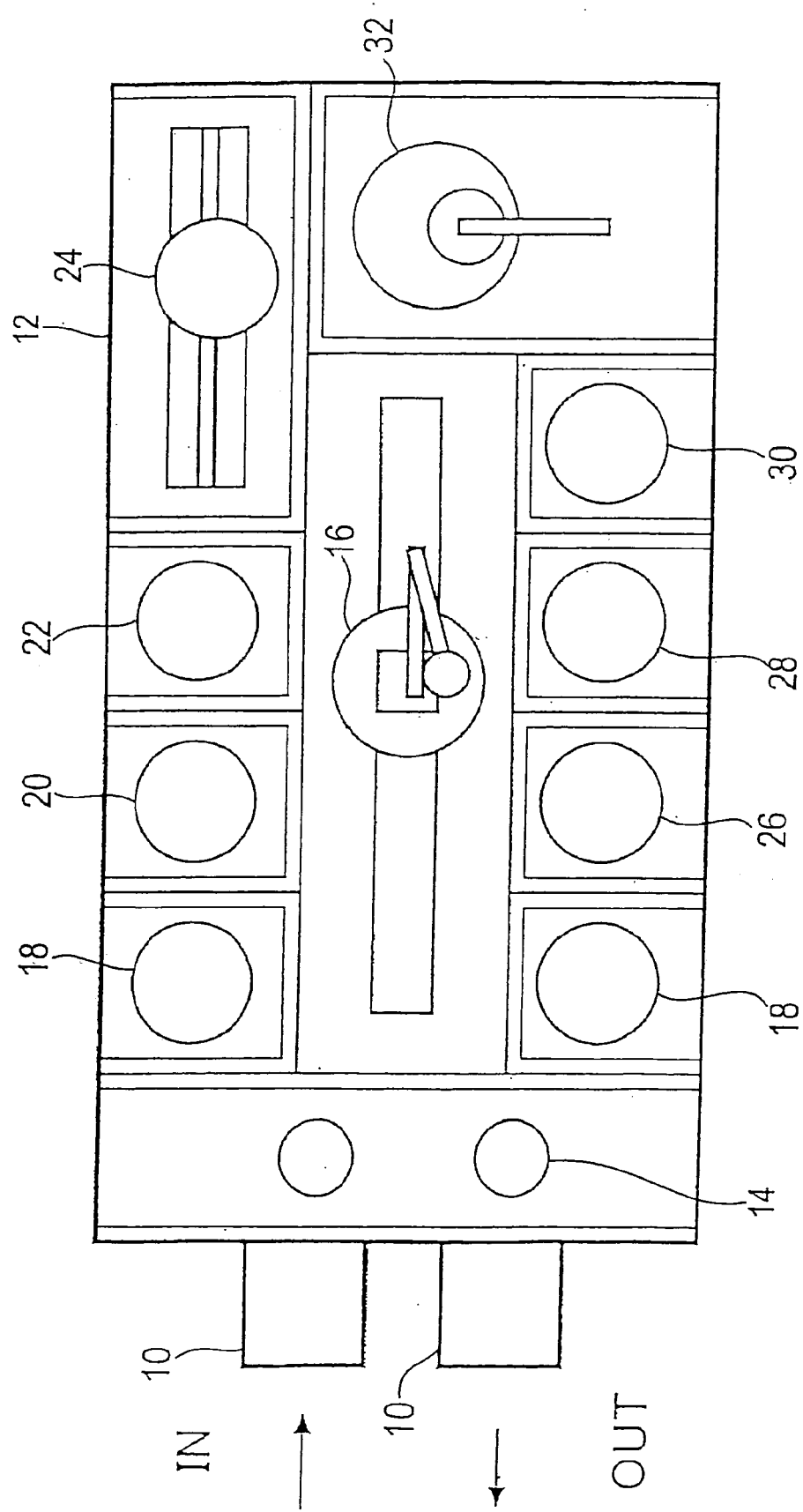
FIG. 2 is a plan view of a substrate processing apparatus incorporating a plating apparatus according to an embodiment of the present invention.

FIG. 2 is a plan view of a substrate processing apparatus incorporating a plating apparatus according to an embodiment of the present invention. As shown in FIG. 2, the substrate processing apparatus comprises a rectangular apparatus frame 12 to which transfer boxes 10 such as SMIF (Standard Mechanical Interface) boxes, which accommodate a number of substrates such as semiconductor wafers, are removably attached. Inside of the apparatus frame 12, there are disposed a loading/unloading station 14, and a movable transfer robot 16 for transferring a substrate to and from the loading/unloading station 14. A pair of plating apparatuses 18 is disposed on both sides of the transfer robot 16. A cleaning and drying apparatus 20, a bevel etching and backside cleaning apparatus 22, and a film thickness measuring instrument 24 are disposed in alignment with each other on one side of the transfer robot 16. On another side of the transfer robot 16, a heat treatment (annealing) apparatus 26, a pretreatment apparatus 28, an electroless plating apparatus 30, and a polishing apparatus 32 are disposed in alignment with each other.

The apparatus frame 12 is shielded so as not to allow light to transmit therethrough, thereby enabling subsequent processes to be performed under a light-shielded condition in the apparatus frame 12. Specifically, the subsequent processes can be performed without irradiating interconnects with light such as illuminating light. By thus preventing the interconnects from being irradiated with light, it is possible to prevent the interconnects of copper from being corroded due to a potential difference of light that is caused by application of light to the interconnects composed of copper, for example.

Figure 3:
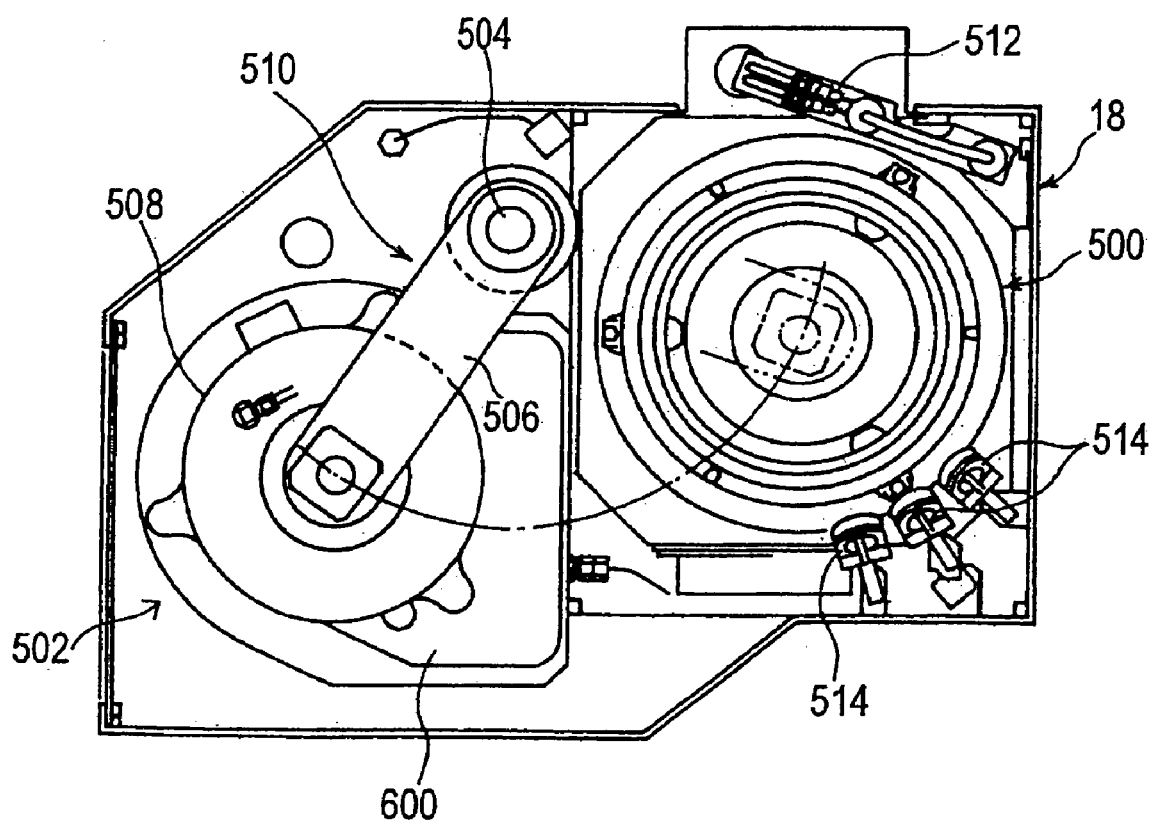
FIG. 3 is a plan view of the plating apparatus shown in FIG. 2.

FIG. 3 is a plan view of the plating apparatus 18. As shown in FIG. 3, the plating apparatus 18 is provided with a plating section 500 for performing a plating process and processing incidental thereto, and an idling stage 502 is disposed adjacent to the plating section 500. There is also provided an electrode arm portion 510 having an electrode head 508 which is held at a front end of a swing arm 506 swingable about a rotating shaft 504, and which is swung between the plating section 500 and the idling stage 502. Furthermore, a pre-coating/recovering arm 512, and fixed nozzles 514, for ejecting pure water or a chemical liquid such as ion water, or a gas or the like toward a substrate, are disposed laterally of the plating section 500. In this embodiment, three of the fixed nozzles 514 are disposed, and one of them is used for supplying pure water.

Figure 4:
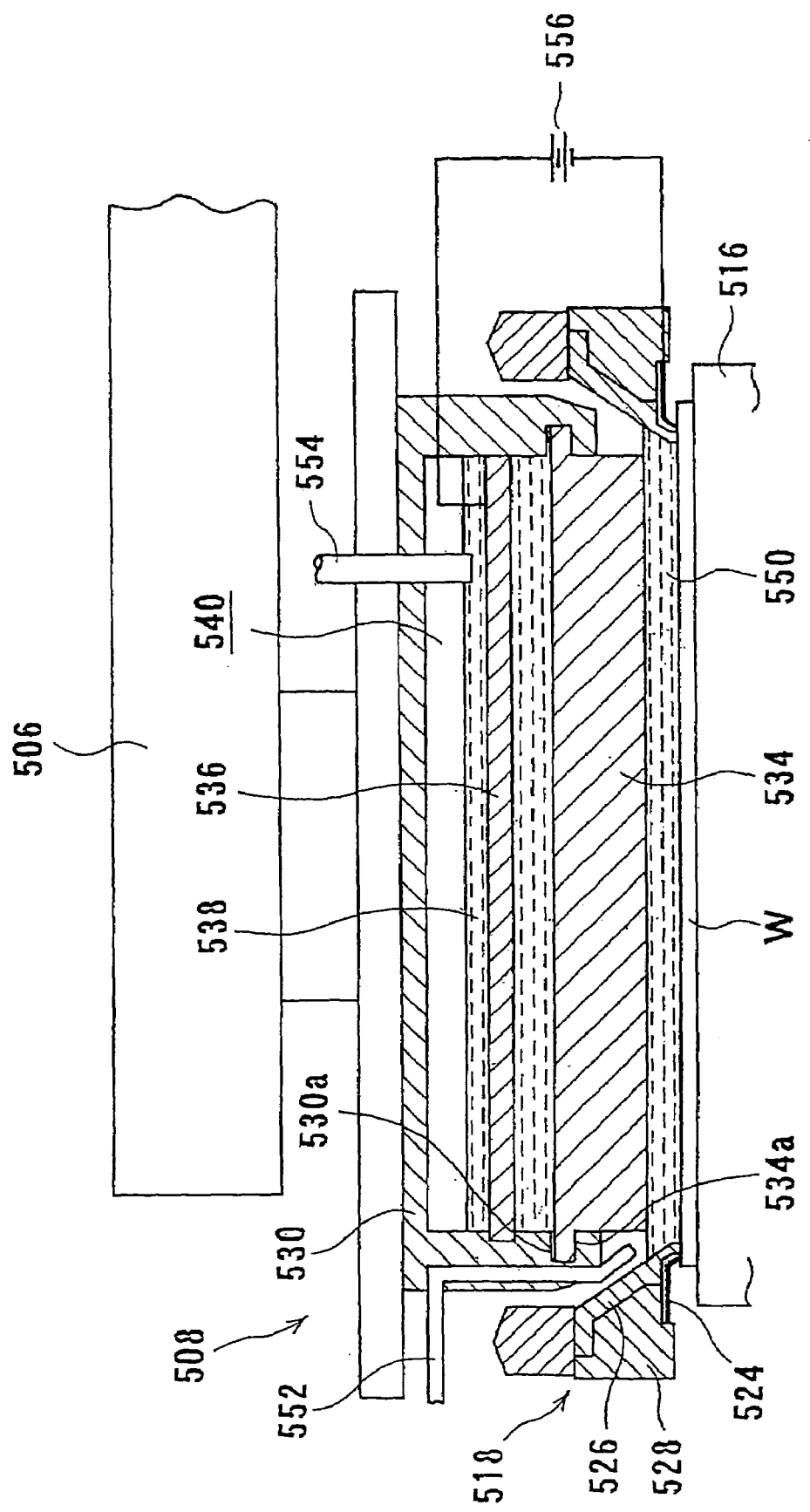
FIG. 4 is a schematic cross-sectional view of an essential part of the plating apparatus shown in FIG. 2, at a time of a plating process.

FIG. 4 shows a manner by which the electrode head 508 is moved to a position right above the plating section 500 and then lowered to perform plating. The electrode head 508 is supported on a distal end of the swing arm 506. The plating section 500 has a vertically movable substrate stage 516 disposed below the electrode head 508 for holding substrate W with its face side (to be plated) facing upwardly, and a cathode portion 518 positioned above the substrate stage 516 and disposed around a peripheral edge of the substrate stage 516. In this embodiment, the electrode head 508 has a diameter slightly smaller than a diameter of the substrate stage 516, and is arranged so as to be able to plate substantially an entire face side (surface to be plated) of the substrate W held by the substrate stage 516 without the electrode head 508 and the substrate stage 516 being changed in relative position. The substrate stage 516 attracts and holds the substrate W on its upper surface.

Though not shown, the substrate stage 516 houses therein a heating device (heater) for controlling a temperature of the substrate stage 516 at a constant level. The substrate stage 516 can be moved vertically by an air cylinder (not shown), and can also be rotated with the cathode portion 518 at a desired acceleration and speed by a rotational motor (not shown) through a belt (not shown). When the substrate stage 516 is elevated, the cathode portion 518, which has a seal member 516 and cathodes 524, is brought into contact with a peripheral portion of the substrate W held by the substrate stage 516.

The swing arm 506 is vertically movable by a vertical displacement motor (not shown), which may comprise a servomotor, through a ball screw, and is also rotatable (swingable) by a turning motor (not shown). These motors may be replaced with pneumatic actuators.

The cathode portion 518 comprises, according to this embodiment, six divided cathodes 524 and an annular seal member 526 mounted in position in covering relation to upper surfaces of the cathodes 524. The cathodes 524 and the seal member 526 are fixed to an inner circumferential surface of a ring-shaped holder 528. The seal member 526 has an inner circumferential surface slanted downwardly in a radially inward direction and is progressively thinner downwardly, with an innermost circumferential edge directed downwardly.

When the substrate stage 516 is elevated, the cathodes 524 are pressed against the peripheral portion of the substrate W held by the substrate stage 516, thereby allowing an electric current to be supplied to the substrate W. At the same time, an innermost circumferential edge of the seal member 526 is pressed against an upper surface of the peripheral portion of the substrate W, thereby sealing the substrate W in a watertight manner. Therefore, plating solution supplied to the upper surface (surface to be plated) of the substrate W is prevented from seeping from the peripheral portion of the substrate W, and hence from contaminating the cathodes 524.

In this embodiment, the cathode portion 518 is vertically immovable and rotatable with the substrate stage 516. However, the cathode portion 518 may be vertically movable, and the seal member 526 may be pressed against the surface to be plated of the substrate W when the cathode portion 518 is lowered.

The electrode head 508 has a downwardly open bottomed cylindrical housing 530 mounted on the free end of the swing arm 506. An opening in a lower end of the electrode head 508 is closed with an electric resistor 534. Specifically, the housing 530 has a groove 530a defined in an inner circumferential surface thereof, and the electric resistor 534 has a flange 534a on its upper end which is fitted in the groove 530a, thereby securing the electric resistor 534 to the housing 530 with a lower portion of the electric resistor 534 projecting downwardly from the opening in the lower end of the electrode head 508. An anode solution chamber 540 is thus defined in the housing in which a disk-shaped anode 536 is disposed. An anode solution 538 is introduced into and held in the anode solution chamber 540 to immerse the anode 536 therein.

The electric resistor 534 is, for example, composed of porous ceramic such as alumina, SiC, mullite, zirconia, titania, cordierite, or the like, or a hard porous material such as sintered polypropylene or polyethylene, or a composite material comprising these materials, or a woven fabric or a non-woven fabric. If an alumina-based ceramic is used as the material of the electric resistor 534, then it has a pore diameter ranging from 30 to 200 µm. If SiC is used as the material of the electric resistor 534, then it has a pore diameter of at most 30 µm. These ceramics have a porosity ranging from 20 to 95%. The electric resistor 534 has a thickness in the range from 1 to 20 mm, preferably in the range from 5 to 20 mm, and more preferably in the range from 8 to 15 mm. In this embodiment, the electric resistor 534 is in the form of a porous ceramic sheet of alumina having a porosity of 30% and an average pore diameter of 100 µm. The electric resistor 534 is impregnated with the anode solution 538. The porous ceramic sheet per se is an insulator, but is constructed so as to have a smaller conductivity than the anode solution 538 by causing the anode solution 538 to enter its inner part complicatedly and follow a considerably long path in a thickness direction.

In this manner, the electric resistor 534 is disposed in the anode solution chamber 540, and generates high resistance. Hence, influence of resistance of the seed layer 6 (see FIG. 1A) as a conductive layer becomes negligible to a degree. Consequently, a difference in current density over the surface of the substrate due to electrical resistance on the surface of the substrate W becomes small, and uniformity of a plated film over the surface of the substrate improves.

The housing 530 has a plating solution inlet pipe 552 for introducing a plating solution 550 into a space that is defined between the substrate W held and elevated by the substrate stage 516 and having its outer peripheral portion sealed by the seal member 526, and the electric resistor 534 positioned when the electrode head 508 is lowered, and surrounded by the seal member 526. Therefore, the space defined between the substrate W and the electric resistor 534, and surrounded by the seal member 526, is filled with the plating solution 550 that is introduced from the plating solution inlet pipe 552.

In this embodiment, the plating solution 550, which contains 25 to 75 g/L of copper ions and at least 0.4 mole/L of an organic acid or an inorganic acid, is introduced from the plating solution inlet pipe 552 into the space defined between the substrate W and the electric resistor 534, and surrounded by the seal member 526. From a standpoint of embeddability of the plated film, an acid concentration in the plating solution 550 should generally be at least 0.4 mole/L, and should preferably be in the range from 0.4 to 1.0 mole/L and more preferably be in the range from 0.4 to 0.8 mole/L. The plating solution 550 contains sulfuric acid, alkane sulfonic acid, or alkanol sulfonic acid. A source of copper ions of the plating solution 550 is at least one copper compound selected from the group including copper sulfate, copper oxide, copper chloride, copper carbonate, copper pyrophosphate, copper alkane sulfonic acid, copper alkanol sulfonic acid, and copper organic acid.

The anode solution 538, which is of the same composition as the plating solution 550, or contains 0 to 75 g/L of copper ions and at most 0.6 mole/L of an organic acid or an inorganic acid, is introduced into the anode solution chamber 540. From a standpoint of in-plane uniformity of a thickness of the plated film, an acid concentration in the anode solution 538 should generally be at most 0.6 mole/L, and should preferably be in the range from 1.0 to 0.6 mole/L and more preferably be in the range from 1.0 to 0.2 mole/L. As with the plating solution 550, the anode solution 538 contains sulfuric acid, alkane sulfonic acid, or alkanol sulfonic acid. A source of copper ions of the anode solution 538 is at least one copper compound selected from the group including copper sulfate, copper oxide, copper chloride, copper carbonate, copper pyrophosphate, copper alkane sulfonic acid, copper alkanol sulfonic acid, and copper organic acid.

Electric conductivity of the anode solution 538 is measured, and at least pure water, an organic acid, or an inorganic acid is added to the anode solution 538 to keep the electric conductivity of the anode solution 538 at a constant level of at most 200 mS/cm at a start of a plating process. The electric conductivity of the anode solution 538 should preferably be managed in a range from 1 to 10 S/m, and more preferably be managed to be at most 3 S/m which is one-half electric conductivity in a normal plating process.

Preferably, a combination of the plating solution 550 and the anode solution 538 comprises a copper sulfate bath including sulfuric acid and copper sulfate and containing at most 58 g/L of copper ions, with the copper sulfate bath comprising a high-concentration copper sulfate bath as the plating solution 550 and a low-concentration copper sulfate bath as the anode solution 538.

The substrate stage 516, which is holding the substrate W, is elevated to a plating position, and the electrode head 508 is lowered to a plating position, as described later. Then, the plating solution 550 is introduced into the space defined between the substrate W and the electric resistor 534 until the space is filled with the plating solution 550. The plating solution 550 is brought into contact with the anode solution 538 that is introduced into and held in the anode solution chamber 540 and also held in the electric resistor 534. The anode solution 538 and the plating solution 550 now serve as a plating bath.

Since the plating solution 330 with a high acid concentration is used as a plating bath that comes into contact with the seed layer 6 (see FIG. 1A) as a conductive layer and actually used in the plating process, embeddability of the plated film is increased. At the same time, since the electric resistor 534 is inserted between the substrate W and the anode 536, and the anode solution 538 with low acid concentration is used as a the plating bath that comes into contact with the anode 536 but not actually used in the plating process, the electric conductivity of the plating bath as a whole is lowered to increase the in-plane uniformity of the thickness of the plated film. Thus, a film having both increased in-plane uniformity of the thickness thereof and increased embeddability can be plated.

The housing 530 has an anode solution suction pipe 554 for drawing the anode solution 538 held in the anode solution chamber 540. The anode 536 has a number of minute holes defined therein. With the electric resistor 534 immersed in the anode solution 538 to seal the anode solution chamber 540 hermetically, when the anode solution 538 in the anode solution chamber 540 is drawn through the anode solution suction pipe 554, the anode solution 538 is drawn from the electric resistor 534 into the anode solution chamber 540, and kept in the electric resistor 534 and the anode solution chamber 540.

The anode solution chamber 540 contains a gas produced by a chemical reaction of the plating process, and may have its internal pressure changed. Therefore, a pressure in the anode solution chamber 540 is controlled at a preset value under feedback control during the plating process.

If a copper film is to be plated, then the anode 536 is made of copper (phosphorus-containing copper) containing 0.03 to 0.05% of phosphorus for suppressing generation of slime. The anode 536 may comprise an insoluble metal such as platinum or titanium, or an insoluble electrode comprising metal on which platinum or the like is plated. Since replacement or the like is unnecessary, the insoluble metal or the insoluble electrode is preferable. Further, the anode 536 may be a net-like anode that allows a plating solution to pass therethrough easily.

The cathodes 524 are electrically connected to the cathode of a plating power source 556 and the anode 536 is electrically connected to an anode of the plating power source 556.

A plating process performed by the plating apparatus will be described below.

First, the substrate W is attracted to and held on the upper surface of the substrate stage 516. Then, the substrate stage 516 is elevated to bring the peripheral portion of the substrate W into contact with the cathodes 524 to allow an electric current to flow through the substrate W. Thereafter, the substrate stage 516 is further elevated to press the seal member 526 against the upper surface of the peripheral portion of the substrate W, thereby sealing the peripheral portion of the substrate W in a watertight manner. In the electrode head 508, on the other hand, the anode solution 538 is held in the electric resistor 534 and the anode solution chamber 540 in the idling stage 502, as describer above. At this time, electric conductivity of the anode solution 538 is measured, and, if necessary, pure water, an organic acid, or an inorganic acid is added to the anode solution 538 to keep the electric conductivity of the anode solution 538 at a constant level of at most 200 mS/cm at a start of the plating process. The electrode head 508 is brought to a predetermined position. Specifically, the swing arm 506 is elevated and then turned to bring the electrode head 508 to a position right above the substrate stage 516. Thereafter, the swing arm 506 is lowered to bring the electrode head 508 to a predetermined position (process position), and stopped when a gap between the substrate held by the substrate stage 516 and the electric resistor 534 of the electrode head 508 reaches a value ranging from 0.1 to 3 mm.

Then, the plating solution 550 is introduced from the plating solution inlet pipe 552 into the space between the substrate W and the electric resistor 534, thereby filling the space with the plating solution 550. The plating solution filled in the space between the substrate W and the electric resistor 534 is brought into contact with the anode solution 538 held in the electric resistor 534 and the anode solution chamber 540, so that the plating solution 550 and the anode solution 538 serve as a plating bath.

While the substrate stage 516 is being rotated at a low speed, if necessary, the cathodes 524 are electrically connected to the cathode of the plating power source 556 and the anode 536 is electrically connected to the anode of the plating power source 556, thereby plating a film on a surface to be plated of the substrate W. After the plating process is continued for a predetermined time, the cathodes 524 and the anode 536 are electrically disconnected from the plating power source 556. Then, the swing arm 506 is elevated and turned to bring the electrode head 508 to its original position (idling position).

Figure 5:
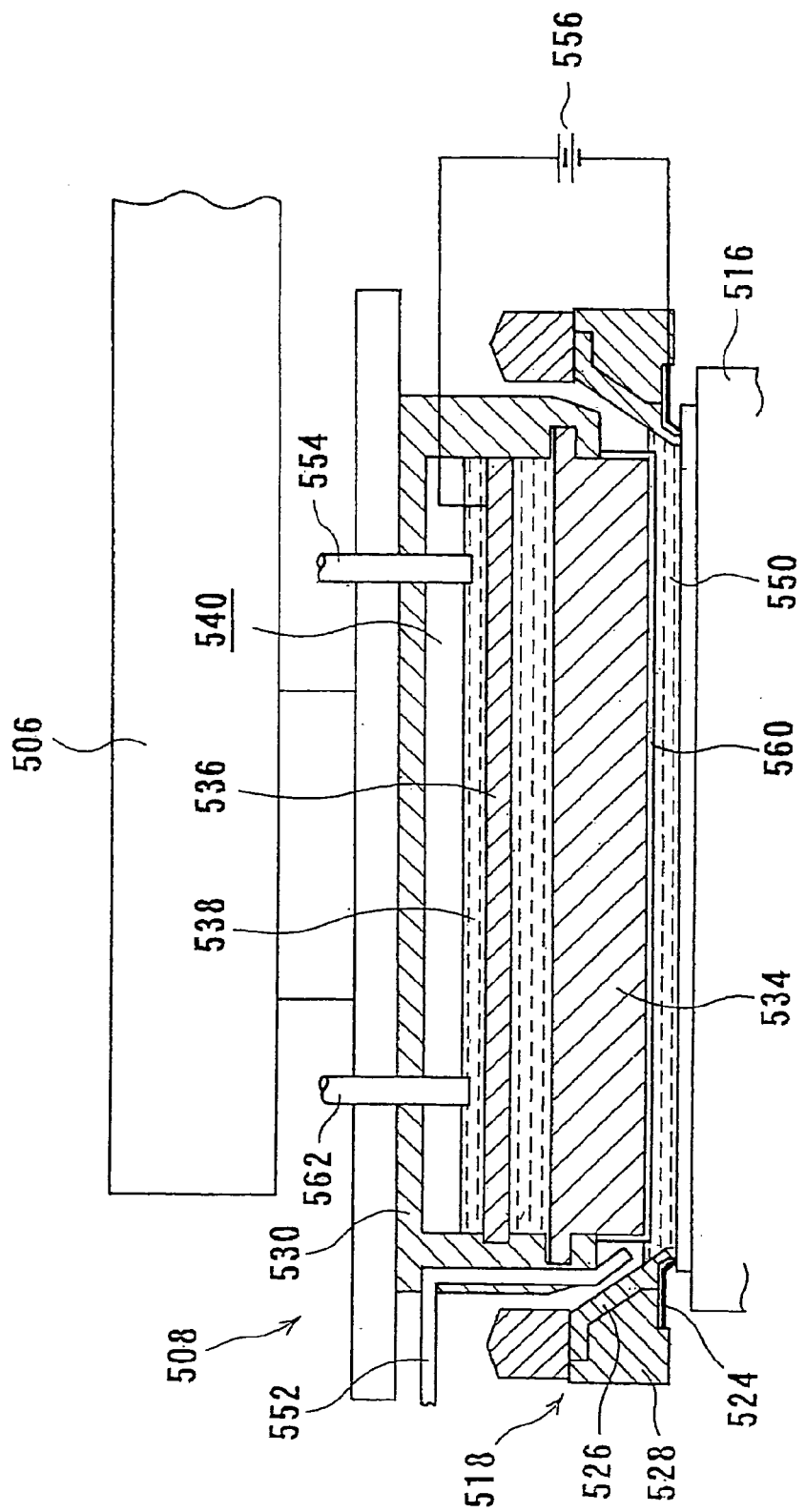
FIG. 5 is a vertical cross-sectional view of an essential part of a plating apparatus according to another embodiment of the present invention.

FIG. 5 shows an essential part of a plating apparatus according to another embodiment of the present invention. The plating apparatus shown in FIG. 5 differs from the plating apparatus shown in FIG. 4 in that an ion exchanger 560 capable of selectively passing only univalent positive ions ($H^+$) therethrough is mounted on an exposed surface (lower surface) of the electric resistor 534, and the housing 530 has an anode solution inlet pipe 562 for introducing the anode solution 538 into the anode solution chamber 540. The anode solution inlet pipe 562 introduces the anode solution 538 into the anode solution chamber 540, and the anode solution suction pipe 554 discharges the anode solution 538 from the anode solution chamber 540.

According to this embodiment, since the ion exchanger 560, capable of selectively passing only univalent positive ions ($H^+$) therethrough, is mounted on the exposed surface of the electric resistor 534, when the plating solution 550 is introduced from the plating solution inlet pipe 552 into the space between the substrate W and the electric resistor 534 to fill the space with the plating solution 550, as described above, the plating solution 550 and the anode solution 538 in the anode solution chamber 540 are separate from each other while they are kept electrically conductive therebetween. Therefore, the plating solution 550 and the anode solution 538 can individually be managed while being prevented from being mixed with each other.

In this embodiment, the ion exchanger 560 is illustrated as being mounted on the exposed surface of the electric resistor 534. However, the electric resistor may partly or wholly be combined with a function as an ion exchanger.

Figure 6:
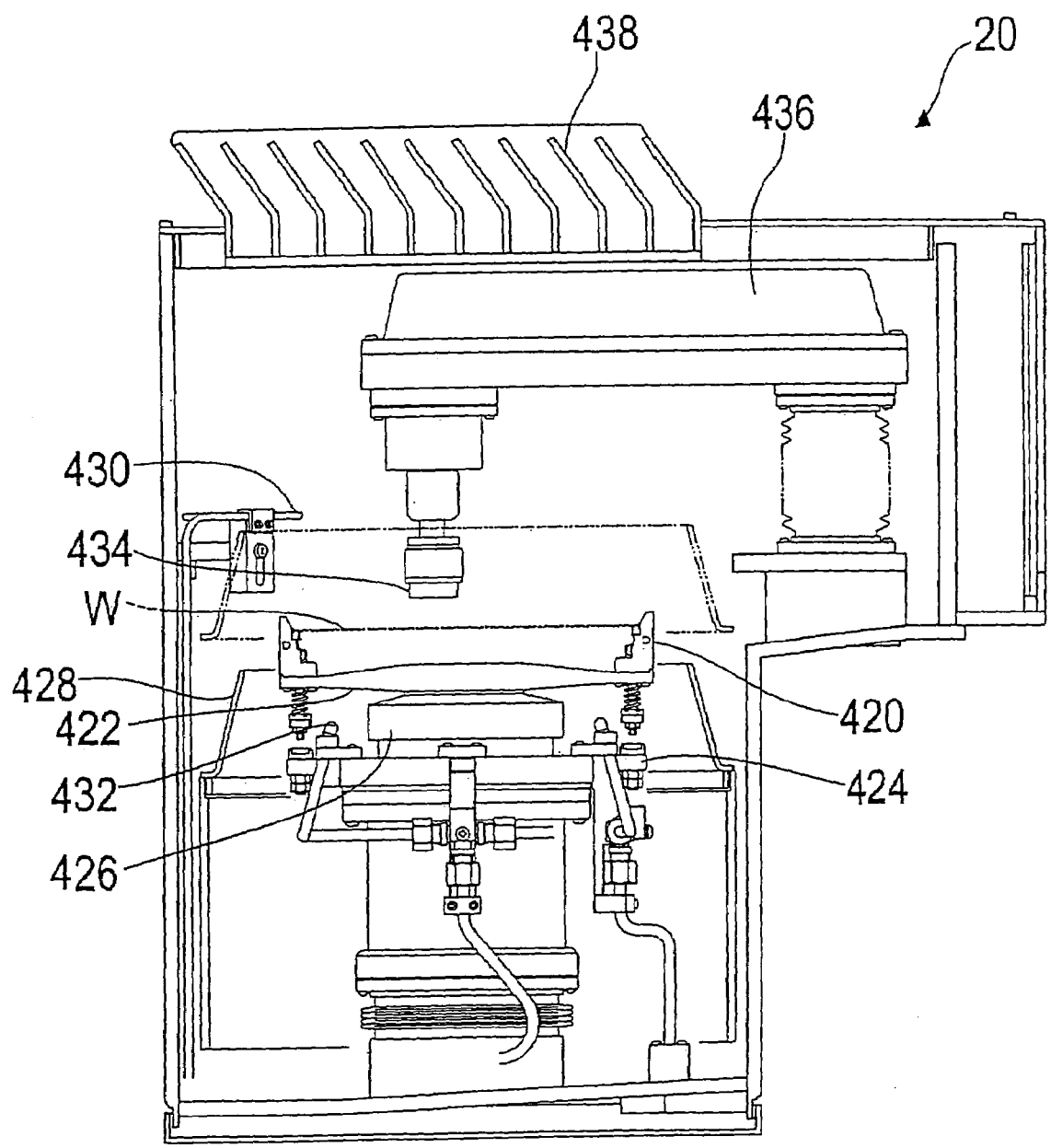
FIG. 6 is a front cross-sectional view, partly in cross section, of a cleaning and drying apparatus shown in FIG. 2.
Figure 7:
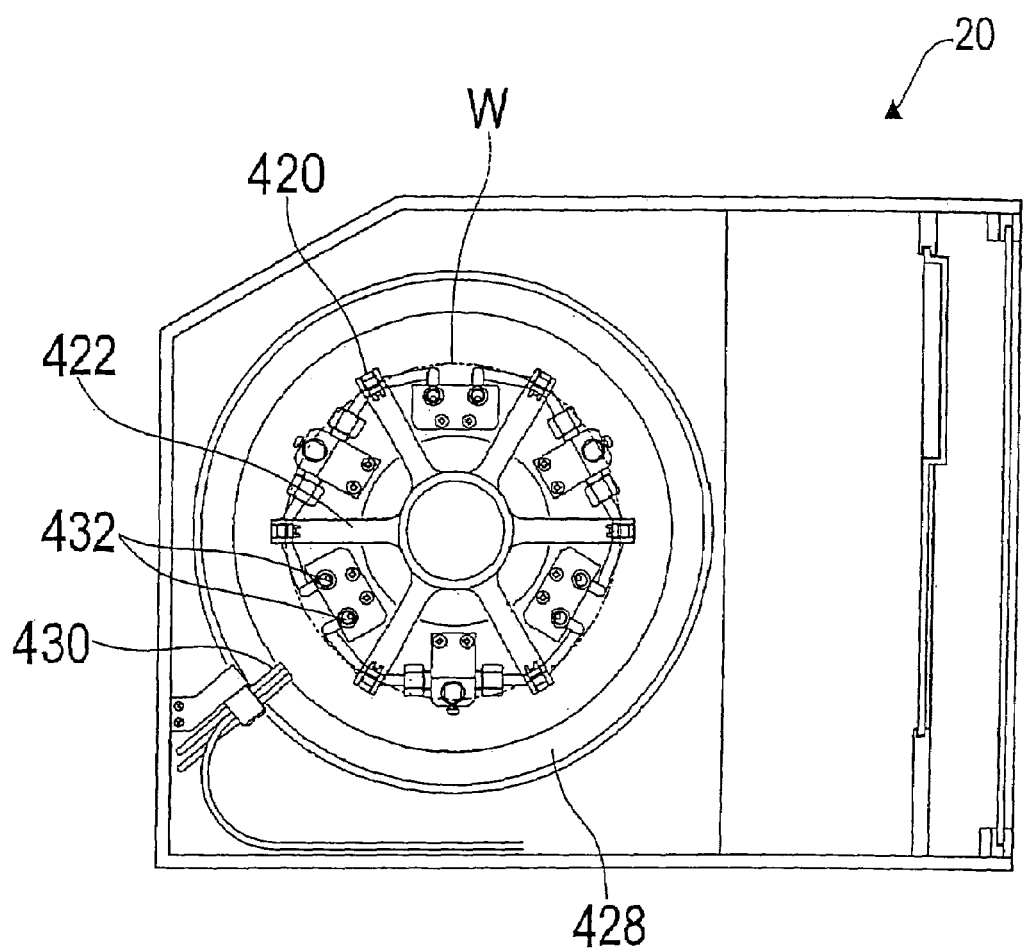
FIG. 7 is a plan view of FIG. 6.

FIGS. 6 and 7 show an example of a cleaning and drying apparatus 20 for cleaning (rinsing) and drying the substrate W. Specifically, the cleaning and drying apparatus 20 performs chemical cleaning and pure water cleaning (rinsing) first, and then complete drying of the substrate W which has been cleaned by spindle rotation. The cleaning and drying apparatus 20 comprises a substrate stage 422 having a clamp mechanism 420 for clamping an edge portion of the substrate W, and a substrate mounting and removing lifting/lowering plate 424 for opening and closing the clamp mechanism 420.

The substrate stage 422 is coupled to an upper end of a spindle 426 which is rotated at a high speed by actuation of a spindle rotating motor (not shown). Further, a cleaning cup 428, for preventing a treatment liquid from being scattered around, is disposed around the substrate W held by the clamp mechanism 420, and the cleaning cup 428 is vertically moved by actuation of a cylinder (not shown).

Further, the cleaning and drying apparatus 20 comprises a chemical liquid nozzle 430 for supplying a treatment liquid to a surface of the substrate W held by the clamp mechanism 420, a plurality of pure water nozzles 432 for supplying pure water to a backside surface of the substrate W, and a pencil-type cleaning sponge 434 which is disposed above the substrate W held by the clamp mechanism 420 and is rotatable. The pencil-type cleaning sponge 434 is attached to a free end of a swing arm 436 which is swingable in a horizontal direction. Clean air introduction ports 438 for introducing clean air into the apparatus are provided at an upper part of the cleaning and drying apparatus 20.

With the cleaning and drying apparatus 20 having the above structure, the substrate W is held by the clamp mechanism 420 and is rotated by the clamp mechanism 420, and while the swing arm 436 is swung, a treatment liquid is supplied from the chemical liquid nozzle 430 to the cleaning sponge 434, and the surface of the substrate W is rubbed with the pencil-type cleaning sponge 434, thereby cleaning the surface of the substrate W. Further, pure water is supplied to the backside surface of the substrate W from the pure water nozzles 432, and the backside surface of the substrate W is simultaneously cleaned (rinsed) by the pure water ejected from the pure water nozzles 432. A thus cleaned substrate W is spin-dried by rotating the spindle 426 at a high speed.

Figure 8:
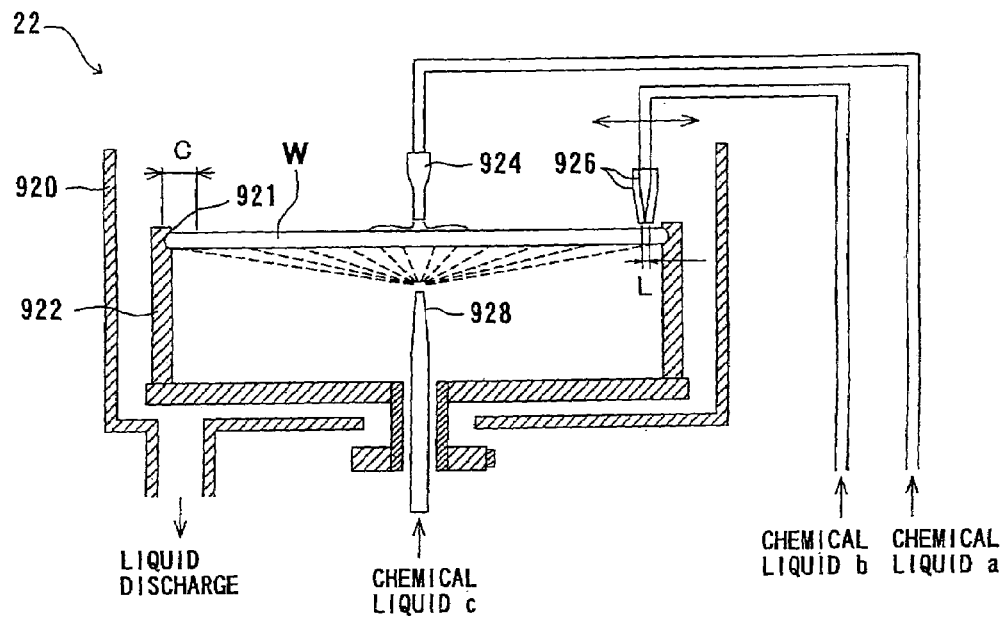
FIG. 8 is a schematic view showing a bevel etching and backside cleaning apparatus shown in FIG. 2.

FIG. 8 shows an example of a bevel etching and backside cleaning apparatus 22. The bevel etching and backside cleaning apparatus 22 can perform etching of the copper layer 7 (see FIG. 1B) deposited on an edge (bevel) portion of the substrate and backside cleaning simultaneously, and can suppress growth of a natural oxide film of copper at a circuit-formed portion on the surface of the substrate. The bevel etching and backside cleaning apparatus 22 has a substrate stage 922 positioned inside a bottomed cylindrical waterproof cover 920 and adapted to rotate the substrate W at a high speed, in such a state that a face of the substrate W faces upward, while holding the substrate W horizontally by spin chucks 921 at a plurality of locations along a circumferential direction of a peripheral portion of the substrate, a central nozzle 924 placed above a nearly central portion of the face of the substrate W held by the substrate stage 922, and an edge nozzle 926 placed above the peripheral portion of the substrate W. The central nozzle 924 and the edge nozzle 926 are directed downward. A back nozzle 928 is positioned below a nearly central portion of the backside of the substrate W, and directed upward. The edge nozzle 926 is adapted to be movable in a diametrical direction of the substrate W and a height direction.

A width of movement L of the edge nozzle 926 is set such that the edge nozzle 926 can be arbitrarily positioned in a direction toward a center from an outer peripheral end surface of the substrate, and a set value for L is inputted, according to size, usage, or the like of the substrate W. Normally, an edge cut width C is set in the range of 2 mm to 5 mm. In a case where a rotational speed of the substrate is at least a certain value at which an amount of liquid migration from the backside to the face is not problematic, a copper layer, and the like within the edge cut width C can be removed.

Next, a method of cleaning with this bevel etching and backside cleaning apparatus 22 will be described. First, the substrate W is horizontally rotated integrally with the substrate stage 922, with the substrate being held horizontally by the spin chucks 921 of the substrate stage 922. In this state, an acid solution is supplied from the central nozzle 924 to the central portion of the face of the substrate W. The acid solution may be a non-oxidizing acid, and hydrofluoric acid, hydrochloric acid, sulfuric acid, citric acid, oxalic acid, or the like is used. On the other hand, an oxidizing agent solution is supplied continuously or intermittently from the edge nozzle 926 to the peripheral portion of the substrate W. As the oxidizing agent solution, one of an aqueous solution of ozone, an aqueous solution of hydrogen peroxide, an aqueous solution of nitric acid, and an aqueous solution of sodium hypochlorite is used, or a combination of these is used.

In this manner, a copper layer, or the like formed on an upper surface and end surface in a region of the edge cut width C of the substrate W is rapidly oxidized with the oxidizing agent solution, and is simultaneously etched with the acid solution supplied from the central nozzle 924 and spread on an entire face of the substrate, whereby the copper layer is dissolved and removed. By mixing the acid solution and the oxidizing agent solution at the peripheral portion of the substrate, a steep etching profile can be obtained, in comparison with a mixture of these solutions which is produced in advance of being supplied. At this time, a copper etching rate is determined by concentrations of the acid solution and oxidizing agent solution. If a natural oxide film of copper is formed in a circuit-formed portion on the face of the substrate, this natural oxide film is immediately removed by the acid solution spreading on the entire face of the substrate according to rotation of the substrate, and does not grow any more. After supply of the acid solution from the central nozzle 924 is stopped, supply of the oxidizing agent solution from the edge nozzle 926 is stopped. As a result, silicon exposed on the surface is oxidized, and deposition of copper can be suppressed.

On the other hand, an oxidizing agent solution and a silicon oxide film etching agent are supplied simultaneously or alternately from the back nozzle 928 to the central portion of the backside of the substrate. Therefore, copper or the like adhering in a metal form to the backside of the substrate W can be oxidized with the oxidizing agent solution, together with silicon of the substrate, and can be etched and removed with the silicon oxide film etching agent. This oxidizing agent solution is preferably the same as the oxidizing agent solution supplied to the face, because the types of chemicals are decreased in number. Hydrofluoric acid can be used as the silicon oxide film etching agent, and if hydrofluoric acid is used as the acid solution on the face of the substrate, the types of chemicals can be decreased in number. Thus, if supply of the oxidizing agent is stopped first, a hydrophobic surface is obtained. If the etching agent solution is stopped first, a water-saturated surface (a hydrophilic surface) is obtained, and thus the backside surface can be adjusted to a condition that will satisfy requirements of a subsequent process.

In this manner, the acid solution, i.e., etching solution is supplied to the substrate W to remove metal ions remaining on the surface of the substrate W. Then, pure water is supplied to replace the etching solution with pure water and remove the etching solution, and then the substrate is dried by spin-drying. In this way, removal of the copper layer in the edge cut width C at the peripheral portion on the face of the substrate, and removal of copper contaminants on the backside, are performed simultaneously to thus allow this treatment to be completed, for example, within 80 seconds. The etching cut width of the edge can be set arbitrarily (from 2 to 5 mm), but the time required for etching does not depend on the cut width.

Figure 9:
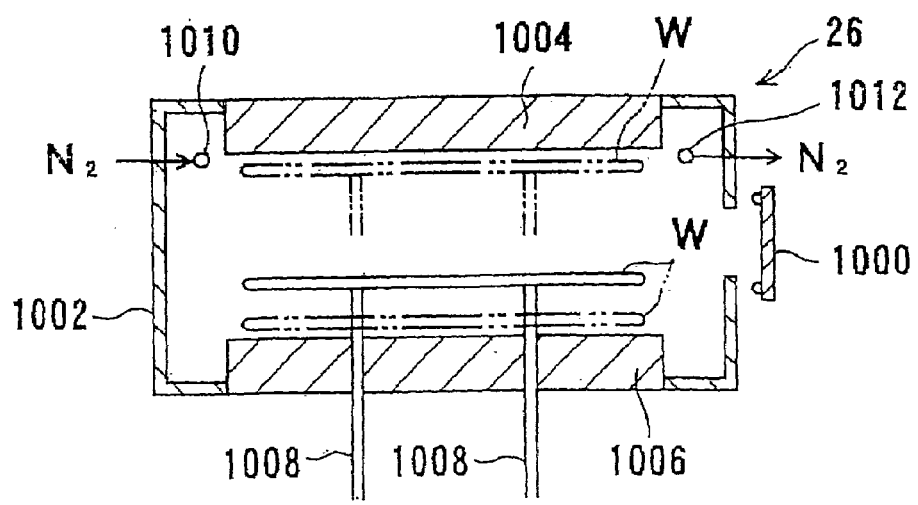
FIG. 9 is a front sectional view of a heat treatment apparatus shown in FIG. 2.
Figure 10:
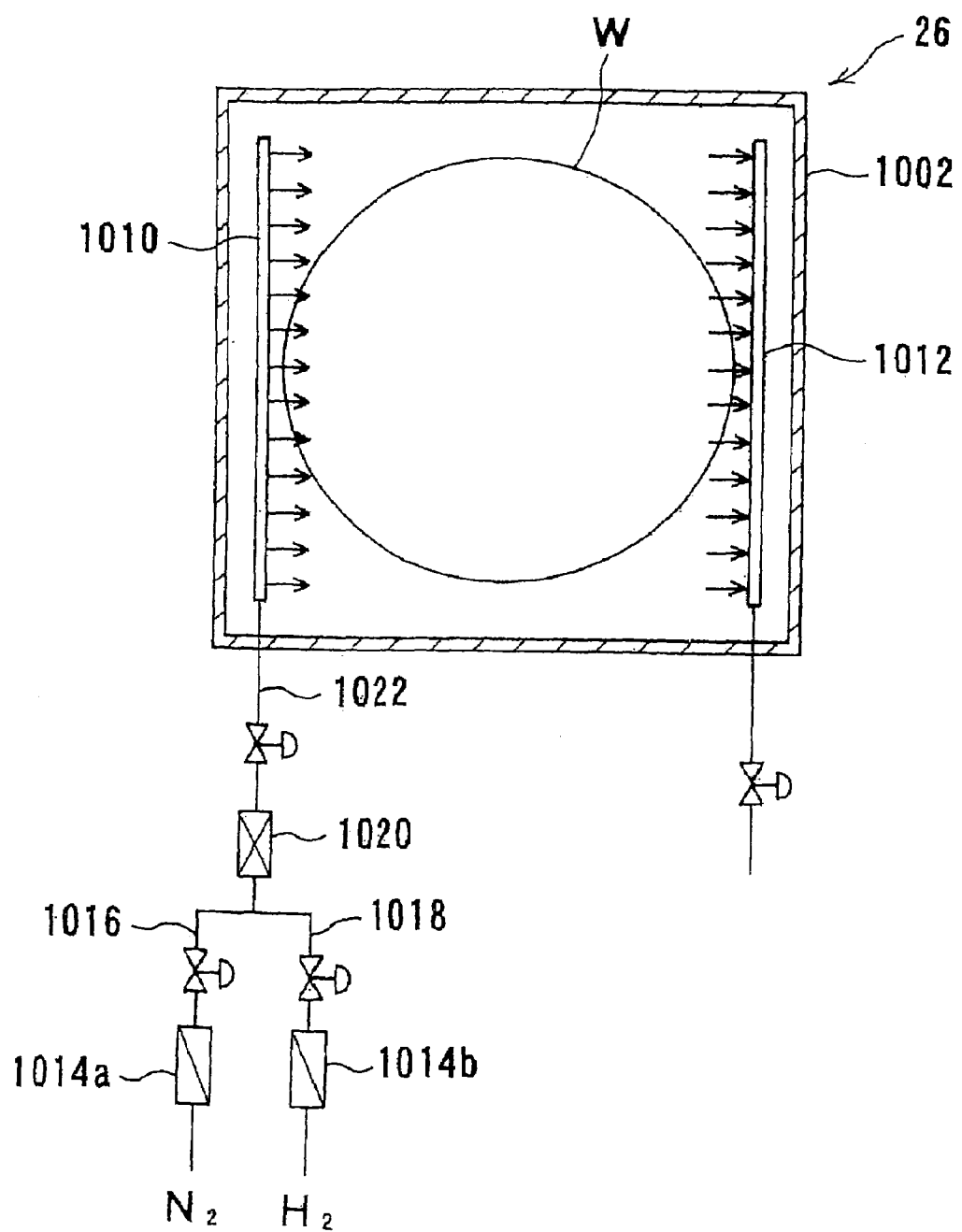
FIG. 10 is a plan cross-sectional view of FIG. 9.

FIGS. 9 and 10 show a heat treatment (annealing) apparatus 26. The annealing apparatus 26 comprises a chamber 1002 having a gate 1000 for taking in and taking out the substrate W, a hot plate 1004 disposed at an upper position in the chamber 1002 for heating the substrate W to e.g. 400°

C., and a cool plate 1006 disposed at a lower position in the chamber 1002 for cooling the substrate W by, for example, flowing cooling water inside the cool plate 1006. The annealing apparatus 26 also has a plurality of vertically movable elevating pins 1008 penetrating the cool plate 1006 and extending upward and downward therethrough for placing and holding the substrate W thereon. The annealing apparatus further includes a gas introduction pipe 1010 for introducing an antioxidant gas between the substrate W and the hot plate 1004 during annealing, and a gas discharge pipe 1012 for discharging the gas which has been introduced from the gas introduction pipe 1010 and flowed between the substrate W and the hot plate 1004. The pipes 1010 and 1012 are disposed on opposite sides of the hot plate 1004.

The gas introduction pipe 1010 is connected to a mixed gas introduction line 1022 which in turn is connected to a mixer 1020 where an $N_2$ gas introduced through an $N_2$ gas introduction line 1016 containing a filter 1014a, and an $H_2$ gas introduced through an $H_2$ gas introduction line 1018 containing a filter 1014b, are mixed to form a mixed gas which flows through the line 1022 into the gas introduction pipe 1010.

In operation, the substrate W, which has been carried in the chamber 1002 through the gate 1000, is held on the elevating pins 1008, and the elevating pins 1008 are raised up to a position at which a distance between the substrate W held on the lifting pins 1008 and the hot plate 1004 becomes about 0.1 to 1.0 mm, for example. In this state, the substrate W is then heated to e.g. 400° C. through the hot plate 1004 and, at the same time, the antioxidant gas is introduced from the gas introduction pipe 1010 and the gas is allowed to flow between the substrate W and the hot plate 1004 while the gas is discharged from the gas discharge pipe 1012, thereby annealing the substrate W while preventing its oxidation. This annealing treatment may be completed in about several tens of seconds to 60 seconds. A heating temperature of the substrate may be selected in the range of 100 to 600° C.

After completion of this annealing, the elevating pins 1008 are lowered to a position at which a distance between the substrate W held on the elevating pins 1008 and the cool plate 1006 becomes 0 to 0.5 mm, for example. In this state, by introducing cooling water into the cool plate 1006, the substrate W is cooled by the cool plate 1006 to a temperature of at most 100° C. in about 10 to 60 seconds. This cooled substrate is transferred to a next step.

In this embodiment, a mixed gas of $N_2$ gas with several percentages of $H_2$ gas is used as the above antioxidant gas. However, $N_2$ gas may be used singly.

FIGS. 11 through 17 show a pretreatment apparatus 28 for performing a pretreatment of electroless plating of a substrate. The pretreatment apparatus 28 includes a fixed frame 52 that is mounted on an upper part of a frame 50, and a movable frame 54 that moves up and down relative to the fixed frame 52. A processing head 60, which includes a bottomed cylindrical housing portion 56, opening downwardly, and a substrate holder 58, is suspended from and supported by the movable frame 54. In particular, a head-rotating servomotor 62 is mounted to the movable frame 54, and the housing portion 56 of the processing head 60 is coupled to a lower end of a downward-extending output shaft (hollow shaft) 64 of the servomotor 62.

Figure 14:
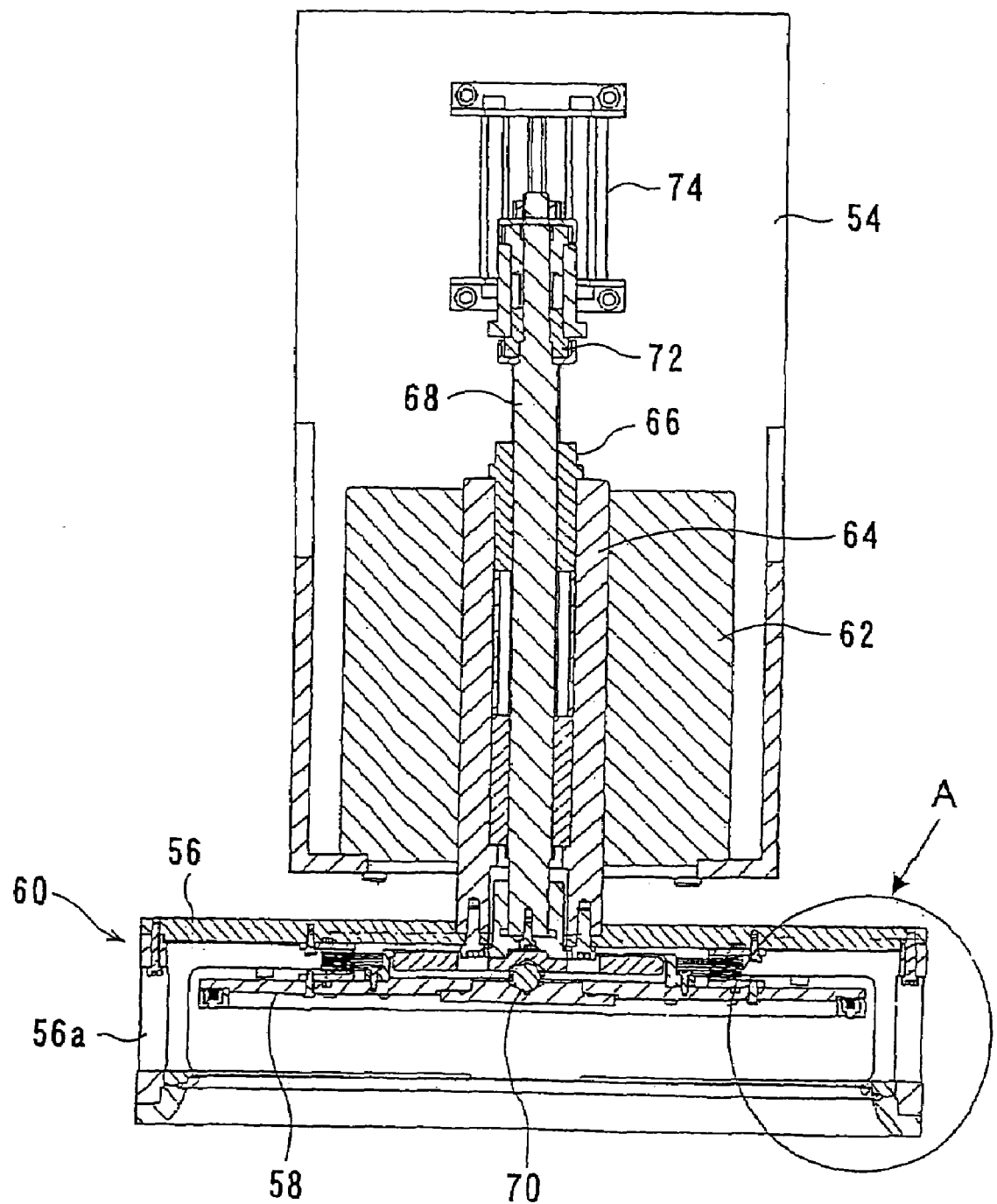
FIG. 14 is a cross-sectional view of a processing head of the pretreatment apparatus shown in FIG. 2, at a time of substrate transfer.
Figure 15:
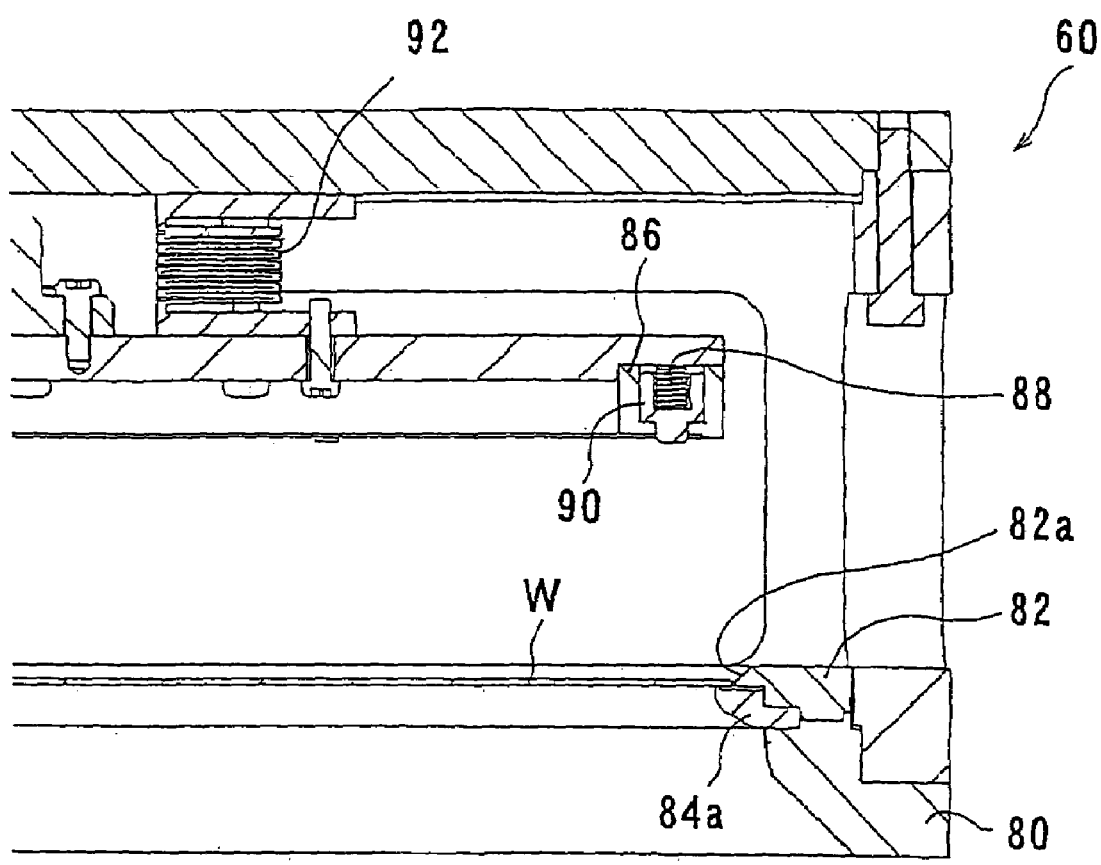
FIG. 15 is an enlarged view of portion A of FIG. 14.

As shown in FIG. 14, a vertical shaft 68, which rotates together with the output shaft 64 via a spline 66, is inserted in the output shaft 64, and the substrate holder 58 of the processing head 60 is coupled to a lower end of the vertical shaft 68 via a ball joint 70. The substrate holder 58 is positioned within the housing portion 56. An upper end of the vertical shaft 68 is coupled via a bearing 72 and a bracket to a fixed ring-elevating cylinder 74 secured to the movable frame 54. Thus, by actuation of the cylinder 74, the vertical shaft 68 moves vertically independently of the output shaft 64.

Linear guides 76, which extend vertically and guide vertical movement of the movable frame 54, are mounted to the fixed frame 52, so that by actuation of a head-elevating cylinder (not shown), the movable frame 54 moves vertically by guidance of the linear guides 76.

Figure 16:
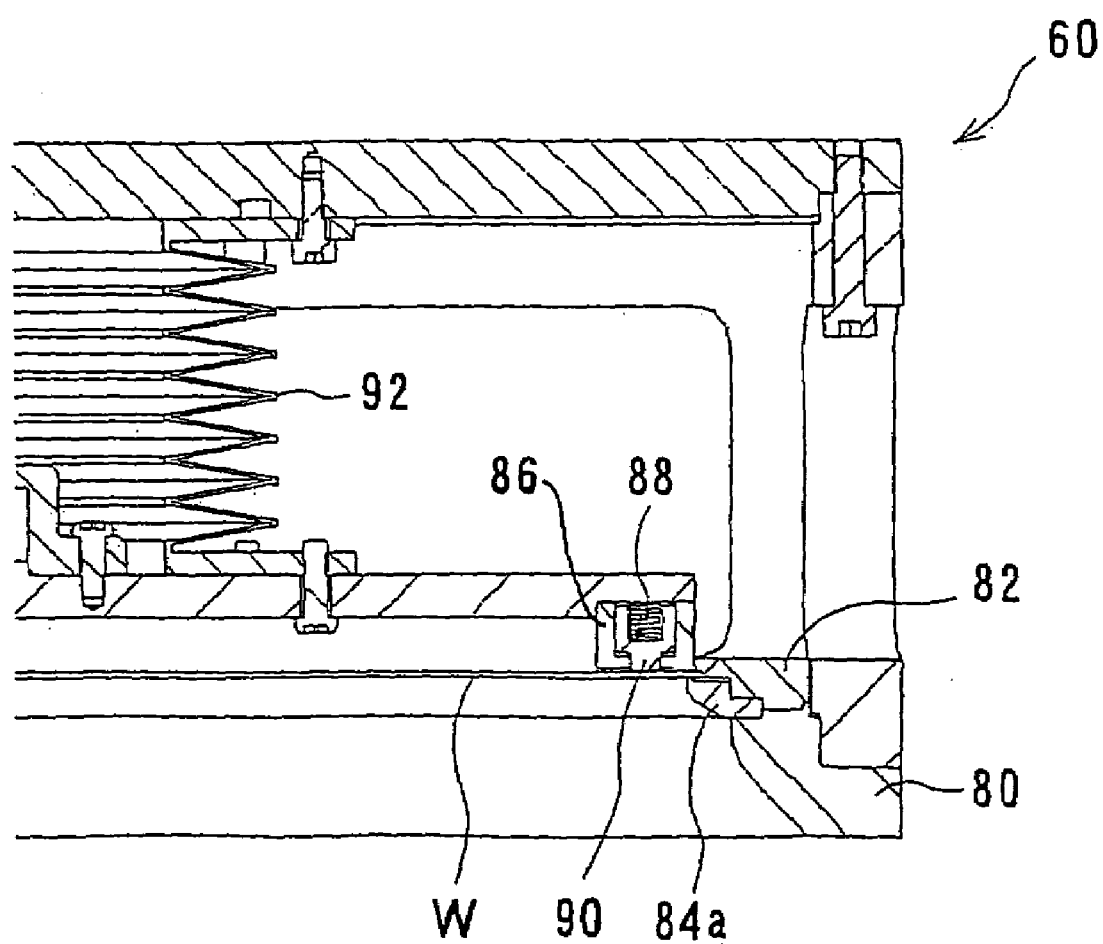
FIG. 16 is a view corresponding to FIG. 15 showing the pretreatment apparatus shown in FIG. 2, at a time of substrate fixing.

Substrate insertion windows 56a for inserting the substrate W into the housing portion 56 are formed in a circumferential wall of the housing portion 56 of the processing head 60. Further, as shown in FIG. 16, a seal ring 84a is provided in a lower portion of the housing portion 56 of the processing head 60, with an outer peripheral portion of the seal ring 84a being sandwiched between a main frame 80 made of e.g. PEEK and a guide frame 82 made of e.g. polyethylene. The seal ring 84a is provided to make contact with a peripheral portion of the lower surface of the substrate W to seal the peripheral portion.

On the other hand, a substrate fixing ring 86 is fixed to a peripheral portion of a lower surface of the substrate holder 58. Columnar pushers 90 each protrude downwardly from a lower surface of the substrate fixing ring 86 by elastic force of a spring 88 disposed within the substrate fixing ring 86 of the substrate holder 58. Further, a flexible cylindrical bellows-like plate 92 made of e.g. Teflon (registered trademark) is disposed between an upper surface of the substrate holder 58 and an upper wall of the housing portion 56 to hermetically seal therein.

When the substrate holder 58 is in a raised position, substrate W is inserted from the substrate insertion window 56a into the housing portion 56. The substrate W is then guided by a tapered surface 82a provided in an inner circumferential surface of the guide frame 82, and positioned and placed at a predetermined position on an upper surface of the seal ring 84a. In this state, the substrate holder 58 is lowered so as to bring the pushers 90 of the substrate fixing ring 86 into contact with the upper surface of the substrate W. The substrate holder 58 is further lowered so as to press the substrate W downwardly by elastic forces of the springs 88, thereby forcing the seal ring 84a to make pressure contact with a peripheral portion of the front surface (lower surface) of the substrate W to seal the peripheral portion while nipping the substrate W between the housing portion 56 and the substrate holder 58 to hold the substrate W.

When the head-rotating servomotor 62 is driven while the substrate W is thus held by the substrate holder 58, the output shaft 64 and the vertical shaft 68 inserted in the output shaft 64 rotate together via the spline 66, whereby the substrate holder 58 rotates together with the housing portion 56.

At a position below the processing head 60, there is provided an upward-open treatment tank 100 comprising an outer tank 100a and an inner tank 100b which have a slightly larger inner diameter than an outer diameter of the processing head 60. A pair of leg portions 104, which is mounted to a lid 102, is rotatably supported on an outer circumferential portion of the treatment tank 100. Further, a crank 106 is integrally coupled to each leg portion 104, and a free end of the crank 106 is rotatably coupled to a rod 110 of a lid-moving cylinder 108. Thus, by actuation of the lid-moving cylinder 108, the lid 102 moves between a treatment position, at which the lid 102 covers a top opening of the treatment tank 100, and a retreat position beside the treatment tank 100. In a surface (upper surface) of the lid 102, there is provided a nozzle plate 112 having a large number of jet nozzles 112a for jetting outwardly (upwardly), for example, electrolytic ionic water having reducing power, as described later.

Figure 17:
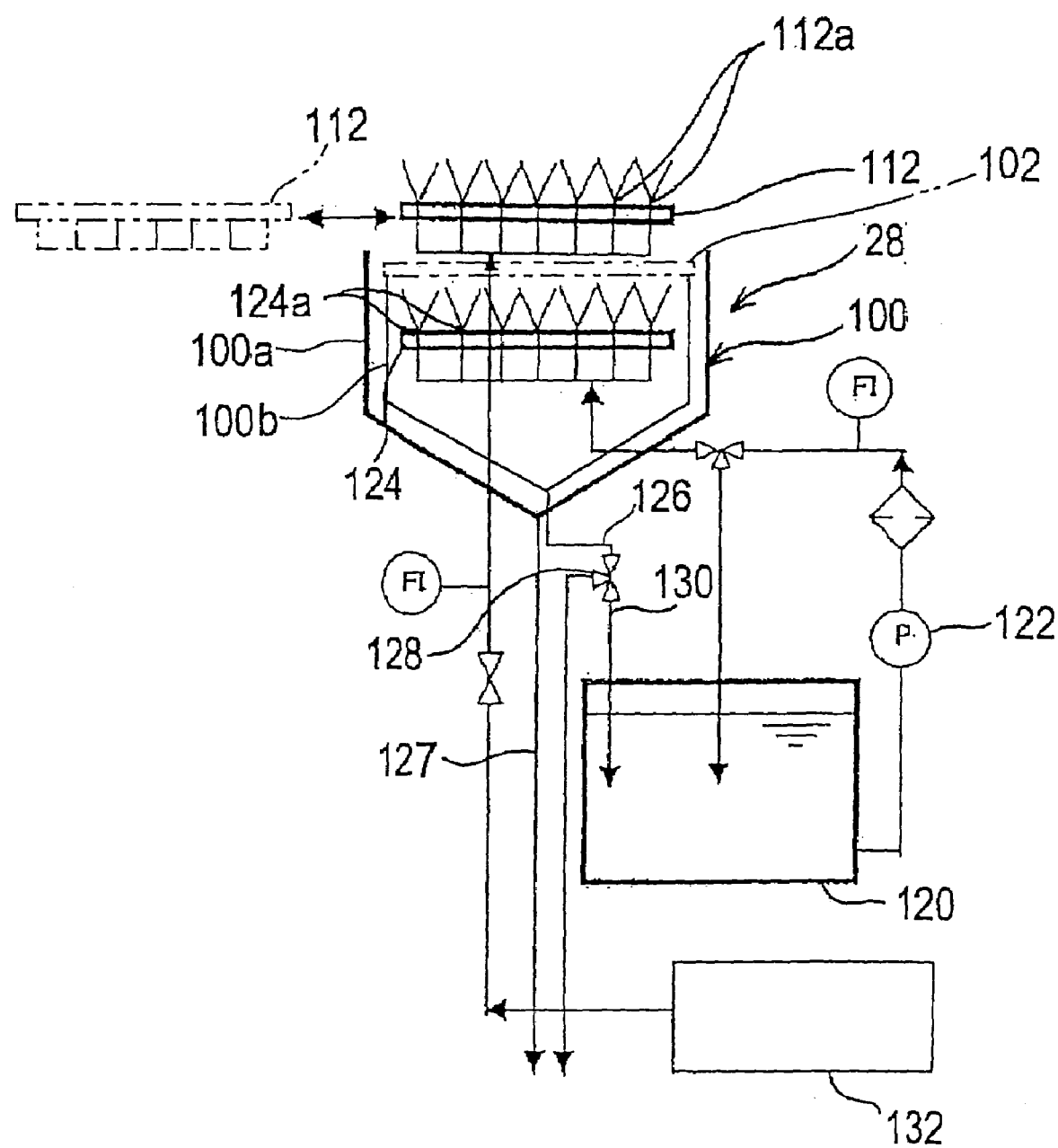
FIG. 17 is a systematic diagram of the pretreatment apparatus shown in FIG. 2.

Further, as shown in FIG. 17, a nozzle plate 124 having a plurality of jet nozzles 124a for jetting upwardly a chemical liquid supplied from a chemical liquid tank 120, by driving a chemical liquid pump 122, is provided in the inner tank 100b of the treatment tank 100 in such a manner that the jet nozzles 124a are equally distributed over an entire surface of a cross section of the inner tank 100b. A drainpipe 126 for draining a chemical liquid (waste liquid) to outside is connected to a bottom of the inner tank 100b. The drainpipe 126 has a three-way valve 128 having an outlet port connected to a return pipe 130 for returning chemical liquid (waste liquid) to the chemical liquid tank 120 for reuse, if necessary. In this embodiment, the nozzle plate 112 mounted on the surface (upper surface) of the lid 102 is connected to a rinsing liquid source 132 for supplying a rinsing liquid such as pure water or the like. A drainpipe 127 is also connected to a bottom of the outer tank 100a.

By lowering the processing head 60 holding the substrate so as to cover or close the top opening of the inner tank 100b of the treatment tank 100 with the processing head 60, and then jetting a chemical liquid from the jet nozzles 124a of the nozzle plate 124 disposed in the inner tank 100b of the treatment tank 100 toward the substrate W, the chemical liquid can be jetted uniformly onto an entire lower surface (surface to be processed) of the substrate W and the chemical liquid can be discharged from the discharge pipe 126 while preventing scattering of the chemical liquid to the outside. Further, by raising the processing head 60 and closing the top opening of the inner tank 100b of the treatment tank 100 with the lid 102, and then jetting a rinsing liquid from the jet nozzles 112a of the nozzle plate 112, disposed on the upper surface of the lid 102, toward the substrate W held in the processing head 60, a rinsing treatment (cleaning treatment) is performed to remove the chemical liquid from the surface of the substrate. Because the rinsing liquid passes through a clearance between the outer tank 100a and the inner tank 100b and is discharged through the drainpipe 127, the rinsing liquid is prevented from flowing into the inner tank 100b and from being mixed with the chemical liquid.

Figure 11:
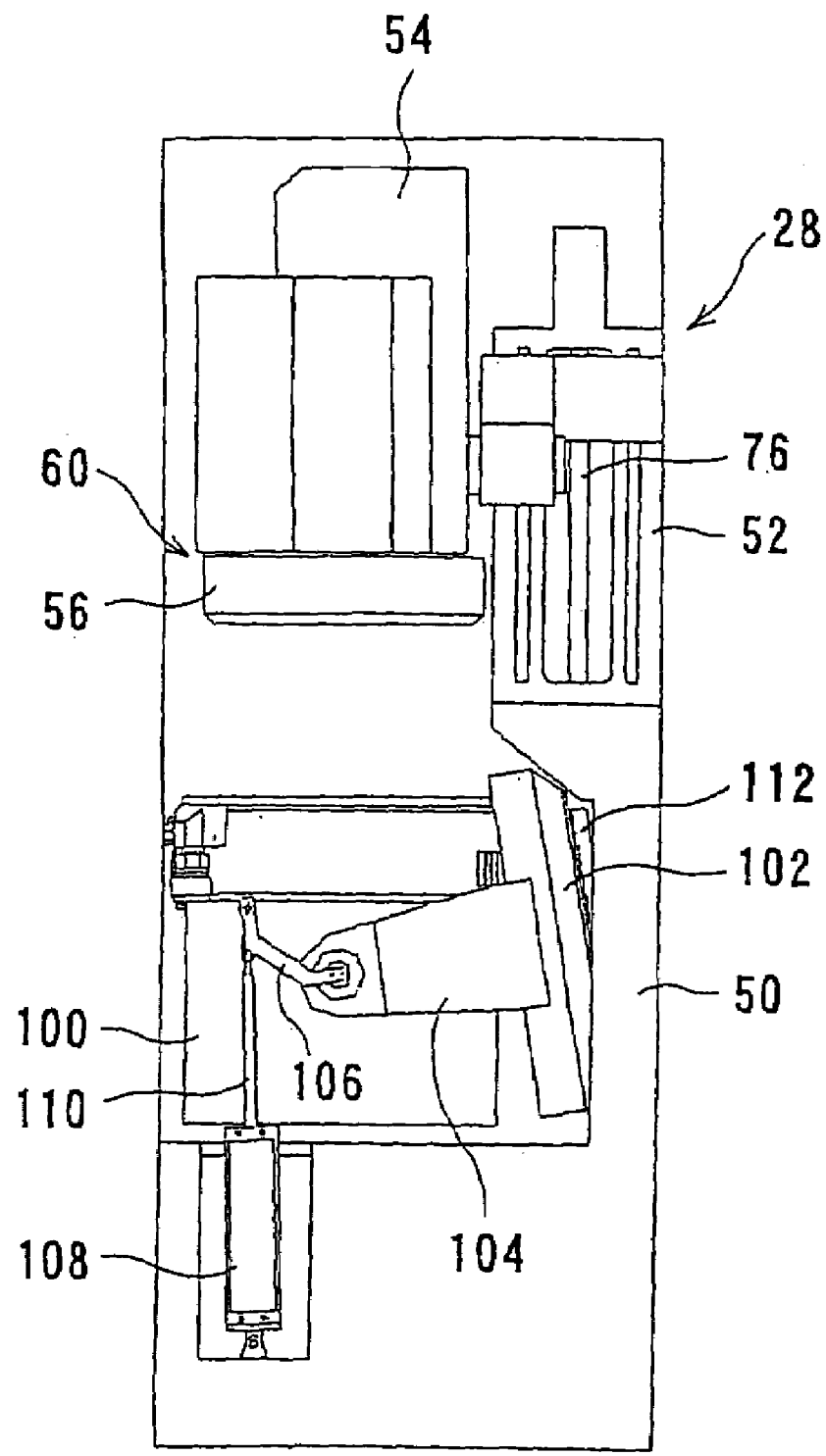
FIG. 11 is a front view of a pretreatment apparatus shown in FIG. 2, at a time of substrate transfer.
Figure 12:
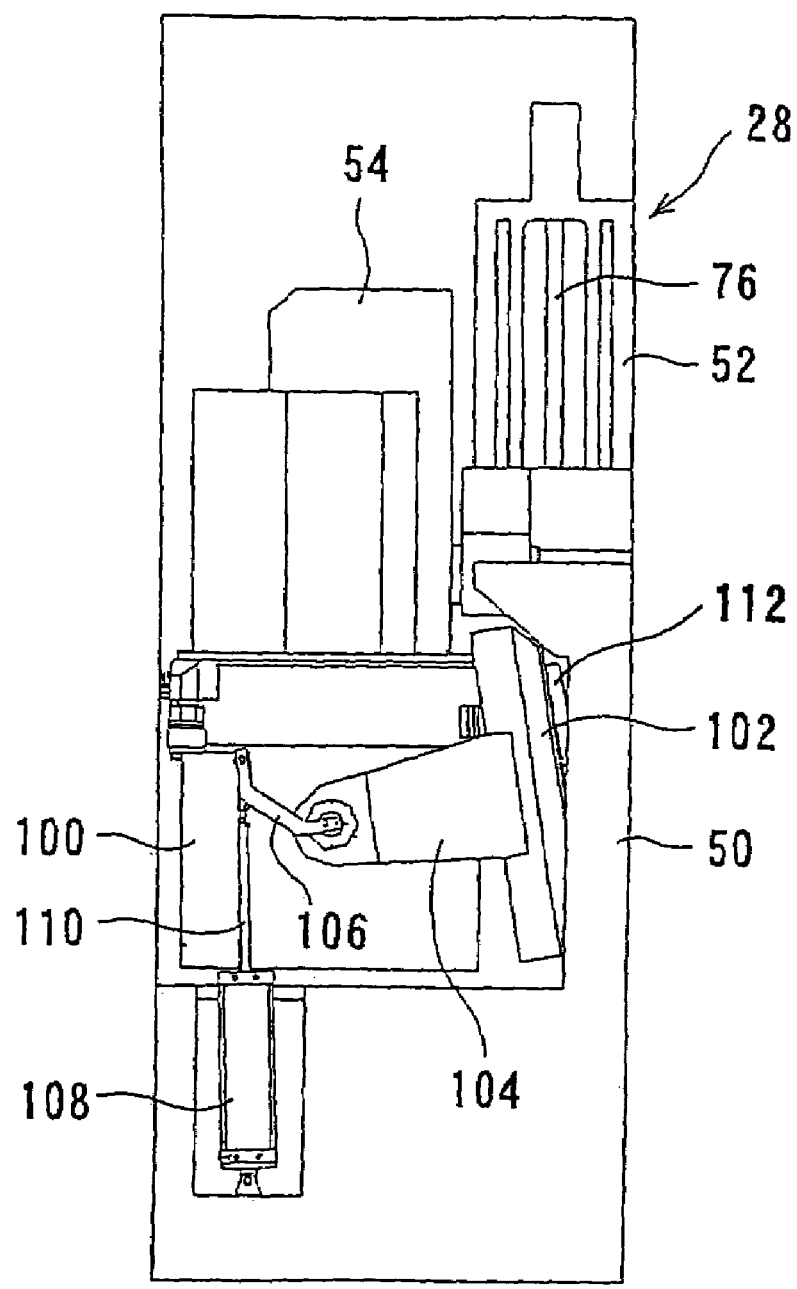
FIG. 12 is a front view of the pretreatment apparatus shown in FIG. 2, at a time of treatment with a chemical solution.
Figure 13:
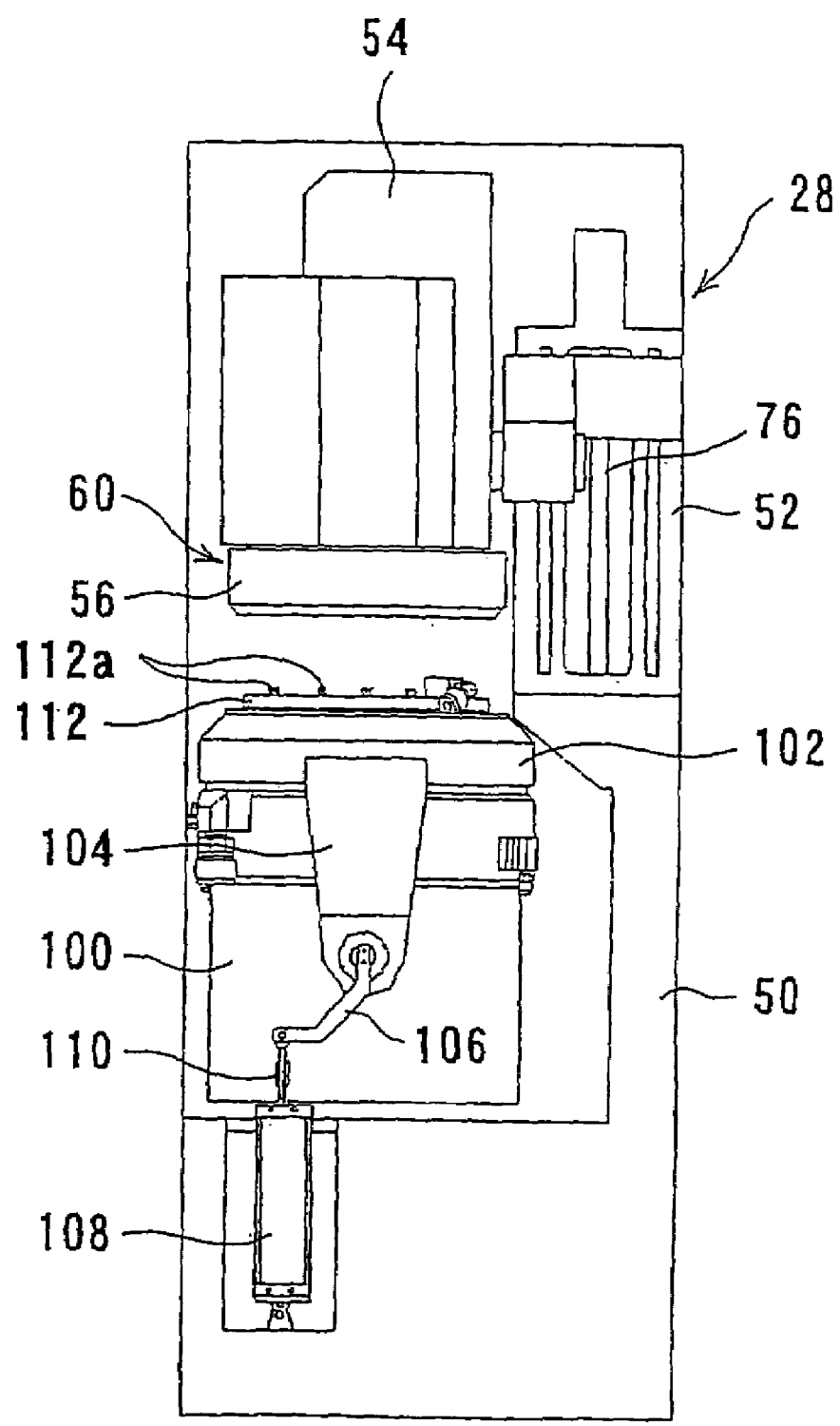
FIG. 13 is a front view of the pretreatment apparatus shown in FIG. 2, at a time of rinsing.

According to the pretreatment apparatus 28, the substrate W is inserted into the processing head 60 and held therein when the processing head 60 is in a raised position, as shown in FIG. 11. Thereafter, as shown in FIG. 12, the processing head 60 is lowered to a position at which it covers the top opening of the inner tank 100b of the treatment tank 100. While rotating the processing head 60 and thereby rotating the substrate W held in the processing head 60, a chemical liquid is jetted from the jet nozzles 124a of the nozzle plate 124, disposed in the inner tank 100b of the treatment tank 100, toward the substrate W, thereby jetting the chemical liquid uniformly onto the entire surface of the substrate W. The processing head 60 is raised and stopped at a predetermined position and, as shown in FIG. 13, the lid 102 in a retreat position is moved to a position at which it covers the top opening of the inner tank 100b of the treatment tank 100. A rinsing liquid is then jetted from the jet nozzles 112a of the nozzle plate 112, disposed on the upper surface of the lid 102, toward the rotating substrate W held in the processing head 60. Chemical treatment, by the chemical liquid, and a rinsing treatment, by the rinsing liquid, of the substrate W can thus be performed successively while avoiding mixing of these two liquids.

A lowermost position of the processing head 60 may be adjusted to adjust a distance between the substrate W held in the processing head 60 and the nozzle plate 124, where by a region of the substrate W onto which the chemical liquid is jetted from the jet nozzles 124a of the nozzle plate 124 and a jetting pressure can be adjusted as desired. Here, when a pretreatment liquid such as a chemical liquid is circulated and reused, active components are reduced by progress of this treatment, and the pretreatment liquid (chemical liquid) is removed due to attachment of the treatment liquid to the substrate. Therefore, it is desirable to provide a pretreatment liquid management unit (not shown) for analyzing composition of the pretreatment liquid and adding insufficient components. Specifically, a chemical liquid used for cleaning is mainly composed of acid or alkali. Therefore, for example, a pH of the chemical liquid is measured, a decreased content is replenished from a difference between a preset value and this measured pH, and a decreased amount is replenished using a liquid level meter provided in the chemical storage tank. Further, with respect to a catalytic liquid, for example, in a case of an acid palladium solution, an amount of acid is measured by its pH, and an amount of palladium is measured by a titration method or nephelometry, and a decreased amount can be replenished in the same manner as above.

FIGS. 18 through 24 show an electroless plating apparatus 30. This electroless plating apparatus 30, which is provided to form the protective film 9 shown in FIG. 1D, includes a plating tank 200 (see FIGS. 22 and 24), and a substrate head 204, disposed above the plating tank 200, for detachably holding a substrate W.

Figure 18:
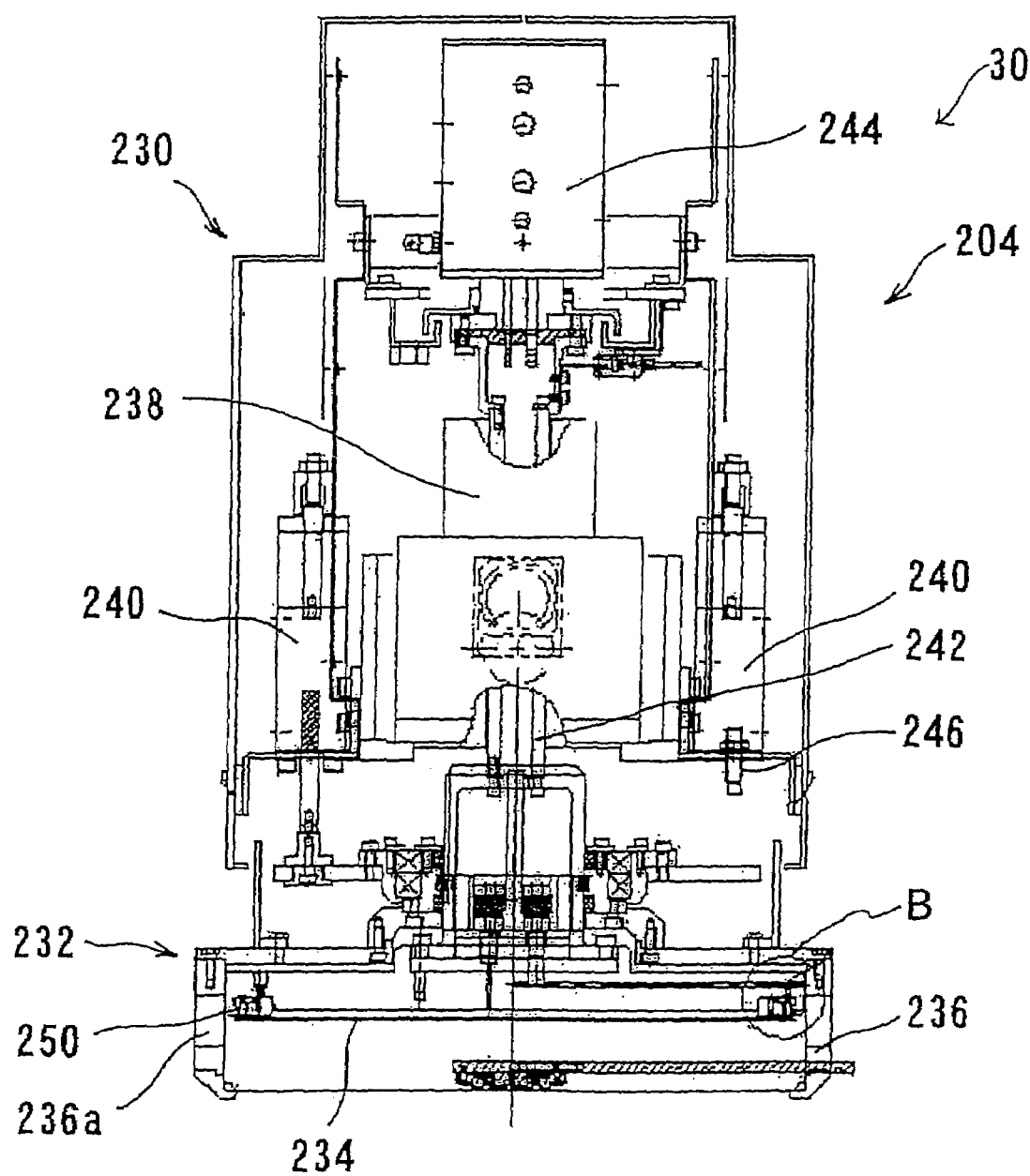
FIG. 18 is a cross-sectional view of a substrate head of an electroless plating apparatus shown in FIG. 2, at a time of substrate transfer.

As shown in detail in FIG. 18, the processing head 204 has a housing 230 and a head portion 232. The head portion 232 mainly comprises a suction head 234 and a substrate receiver 236 for surrounding the suction head 234. The housing 230 accommodates therein a substrate rotating motor 238 and substrate receiver drive cylinders 240. The substrate rotating motor 238 has an output shaft (hollow shaft) 242 having an upper end coupled to a rotary joint 244 and a lower end coupled to the suction head 234 of the head portion 232. The substrate receiver drive cylinders 240 have respective rods coupled to the substrate receiver 236 of the head portion 232. Stoppers 246 are provided in the housing 230 for mechanically limiting upward movement of the substrate receiver 236.

The suction head 234 and the substrate receiver 236 are operatively connected to each other by a splined structure such that when the substrate receiver drive cylinders 240 are actuated, the substrate receiver 236 vertically moves relative to the suction head 234, and when the substrate rotating motor 238 is driven, the output shaft 242 thereof is rotated to rotate the suction head 234 with the substrate receiver 236.

Figure 19:
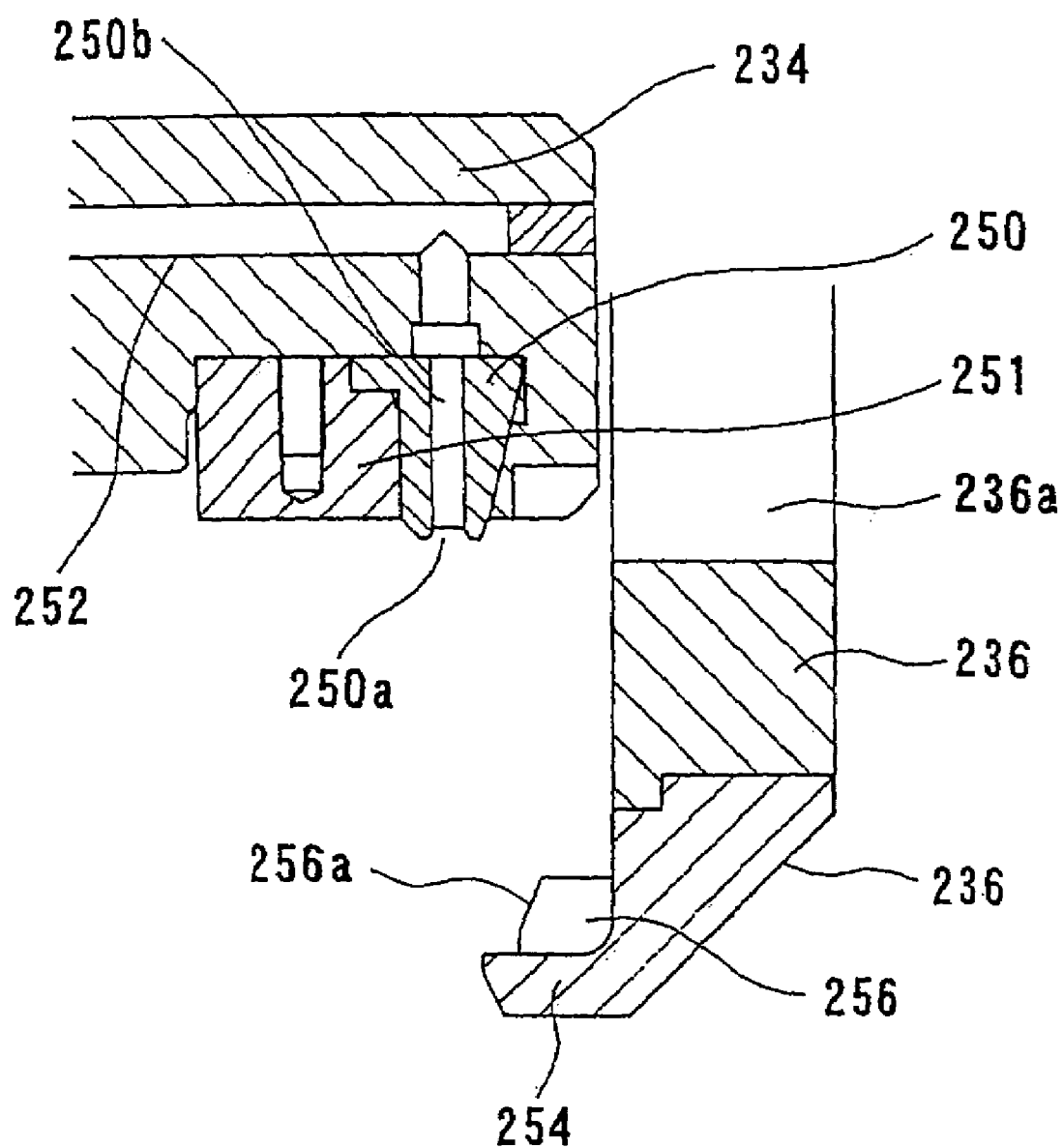
FIG. 19 is an enlarged view of portion B of FIG. 18.
Figure 20:
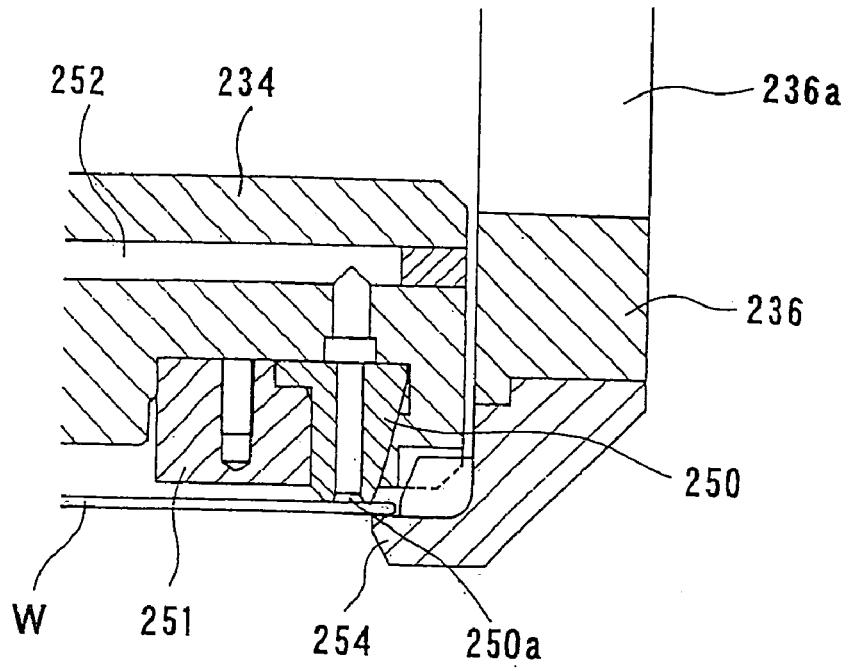
FIG. 20 is a view corresponding to FIG. 19 showing the substrate head of the electroless plating apparatus shown in FIG. 2, at a time of substrate fixing.
Figure 21:
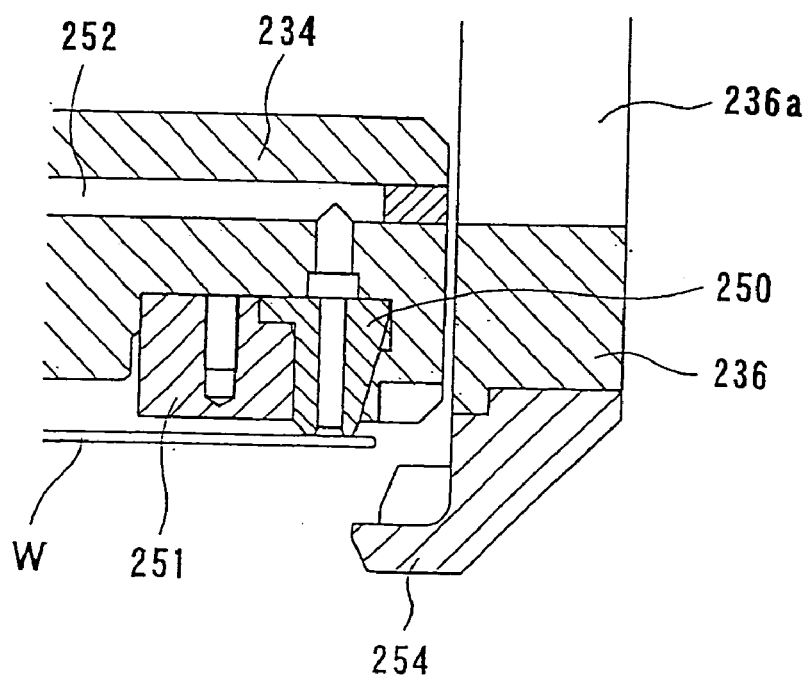
FIG. 21 is a view corresponding to FIG. 19 showing the substrate head of the electroless plating apparatus shown in FIG. 2, at a time of plating process.

As shown in detail in FIGS. 19 through 21, a suction ring 250 for attracting and holding a substrate W against its lower surface to be sealed is mounted on a lower circumferential edge of the suction head 234 by a presser ring 251. The suction ring 250 has a recess 250a continuously defined in a lower surface thereof in a circumferential direction and in communication with a vacuum line 252 extending through the suction head 234 by a communication hole 250b that is defined in the suction ring 250. When the recess 250a is evacuated, the substrate W is attracted to and held by the suction ring 250. Because the substrate W is attracted under vacuum to the suction ring 250 along a radially narrow circumferential area provided by the recess 250a, any adverse effects such as flexing caused by the vacuum on the substrate W are minimized. When the suction ring 250 is dipped in a plating solution (treatment liquid), not only the surface (lower surface) of the substrate W, but also its circumferential edge, can be dipped in the plating solution. The substrate W is released from the suction ring 250 by introducing $N_2$ into the vacuum line 252.

The substrate receiver 236 is in the form of a downwardly open, hollow bottomed cylinder having substrate insertion windows 236a defined in a circumferential wall thereof for inserting therethrough the substrate W into the substrate receiver 236. The substrate receiver 236 also has a disk-like ledge 254 projecting inwardly from its lower end. Protrusions 256, each having a tapered inner circumferential surface 256a for guiding the substrate W, are disposed on an upper surface of the ledge 254.

As shown in FIG. 19, when the substrate receiver 236 is lowered, the substrate W is inserted through a substrate insertion window 236a into the substrate receiver 236. The substrate W thus inserted is guided by the tapered surfaces 256a of the protrusions 256 and positioned thereby onto an upper surface of the ledge 254 in a predetermined position thereon. The substrate receiver 236 is then elevated until it brings an upper surface of the substrate W placed on the ledge 254 into abutment with the suction ring 250 of the suction head 234, as shown in FIG. 20. Then, the recess 250a in the vacuum ring 250 is evacuated through the vacuum line 252 to attract and hold the substrate W while sealing an upper peripheral edge surface of the substrate W against a lower surface of the suction ring 250. In order to plate the substrate W, as shown in FIG. 21, the substrate receiver 236 is lowered several mm to space the substrate W from the ledge 254, thereby keeping the substrate W attracted only by the suction ring 250. The substrate W now has its lower peripheral edge surface prevented from not being plated because it is held out of contact with the ledge 254.

Figure 22:
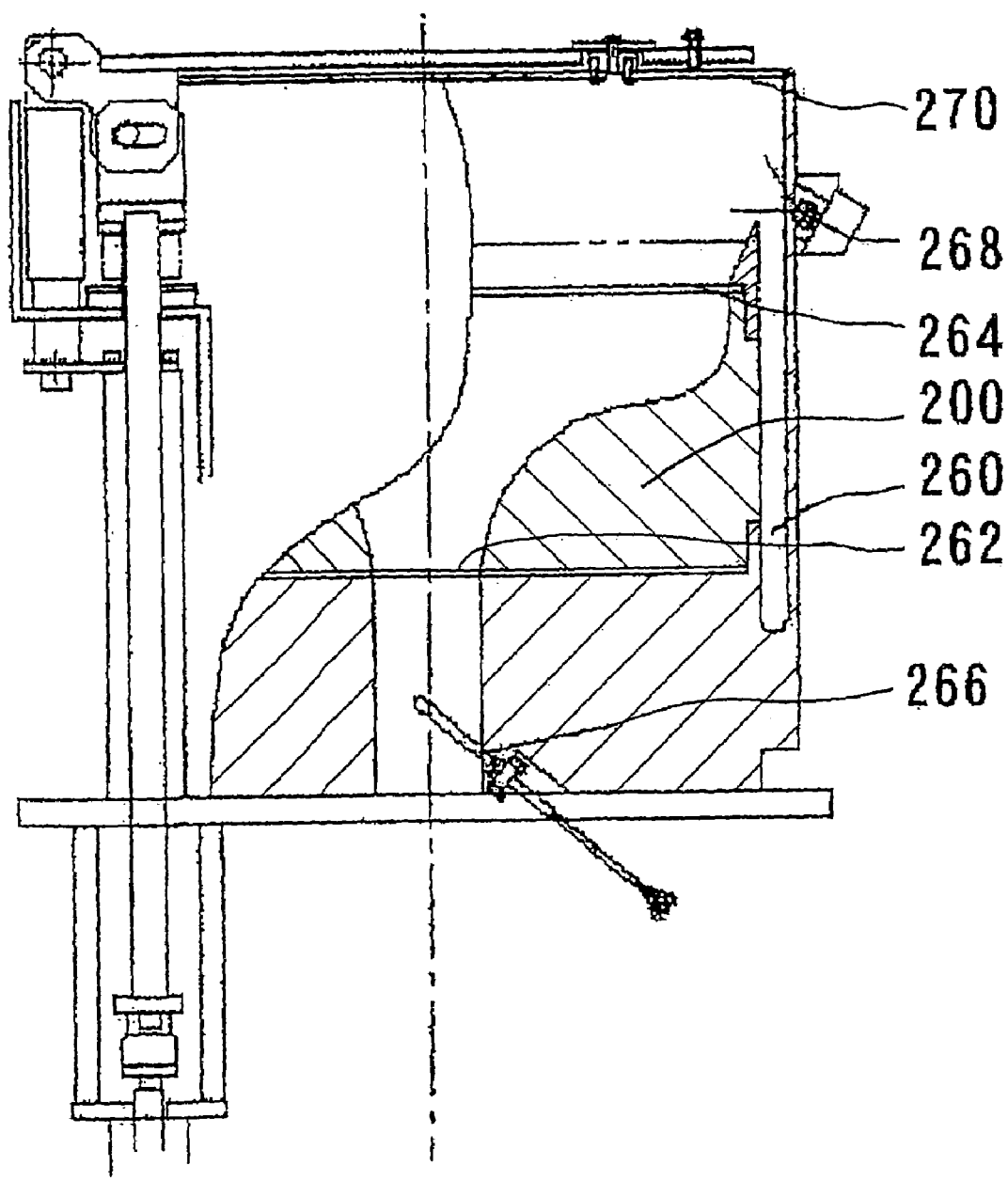
FIG. 22 is a front view with partial cross-section showing a plating tank of the electroless plating apparatus shown in FIG. 2 when a plating tank cover is closed.

FIG. 22 shows details of the plating tank 200. The plating tank 200 is connected at a bottom thereof to a plating solution supply pipe 308 (see FIG. 24), and is provided in a peripheral wall with a plating solution recovery groove 260. In the plating tank 200, there are disposed two current plates 262, 264 for stabilizing flow of a plating solution flowing upward. A thermometer 266, for measuring a temperature of the plating solution introduced into the plating tank 200, is disposed at a bottom of the plating tank 200. Further, on an outer surface of the peripheral wall of the plating tank 200 and at a position slightly higher than a liquid level of plating solution held in the plating tank 200, there is provided a jet nozzle 268 for jetting a stop liquid which is a neutral liquid having a pH of 6 to 7.5, for example, pure water, inwardly and slightly upwardly in a normal direction. After plating, the substrate W held in the head portion 232 is raised and stopped at a position slightly above a surface of the plating solution. In this state, pure water (stop liquid) is immediately jetted from the jet nozzle 268 toward the substrate W to cool the substrate W, thereby preventing progress of plating by the plating solution remaining on the substrate W.

Further, at a top opening of the plating tank 200, there is provided an openable/closable plating tank cover 270 which closes the top opening of the plating tank 200 during a non-plating time, such as idling time, so as to prevent unnecessary evaporation of plating solution from the plating tank 200.

Figure 24:
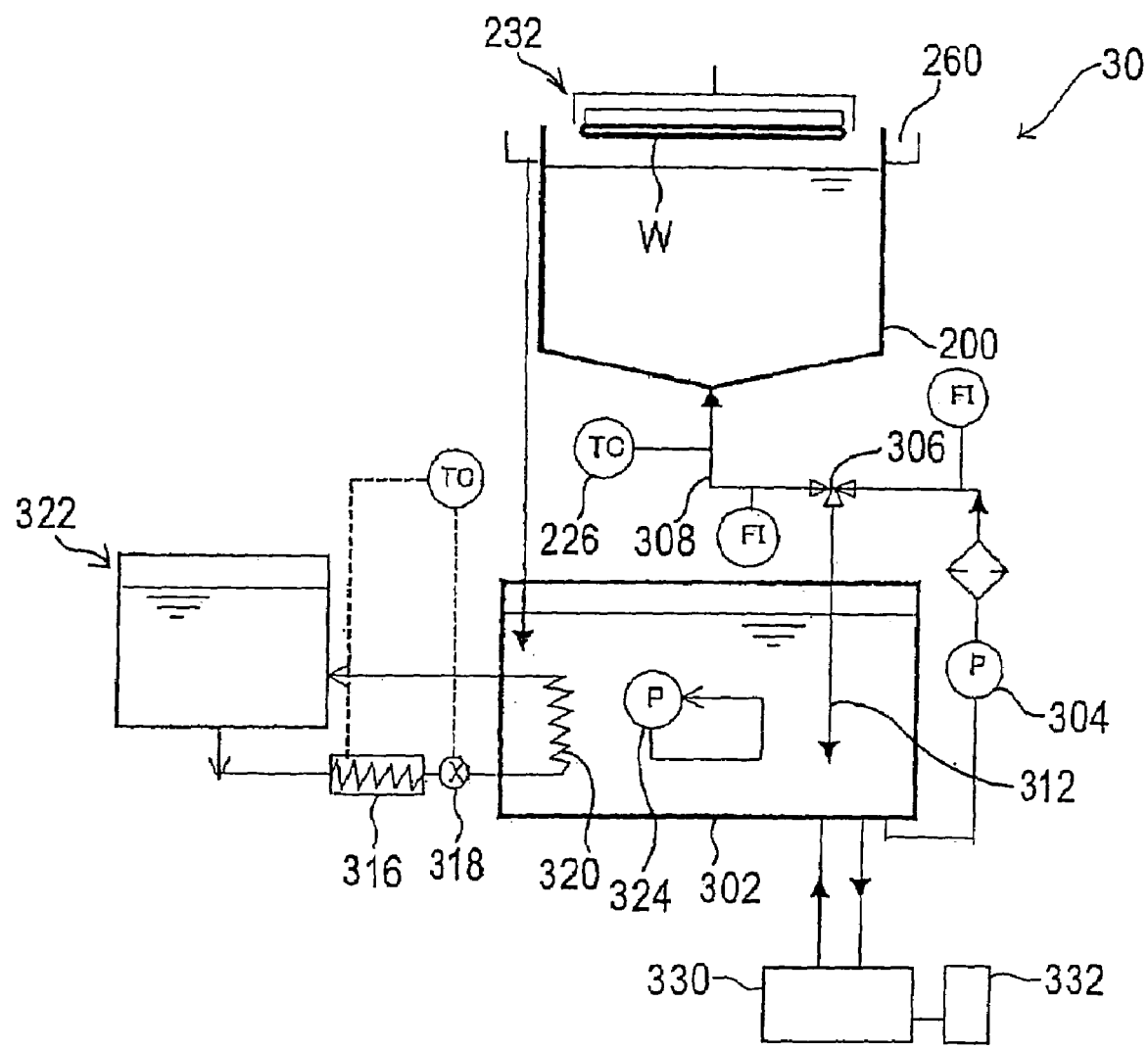
FIG. 24 is a systematic diagram of the electroless plating apparatus shown in FIG. 2.

As shown in FIG. 24, a plating solution supply pipe 308, extending from a plating solution storage tank 302 and having a plating solution supply pump 304 and a three-way valve 306, is connected to the plating tank 200 at the bottom of the plating tank 200. With this arrangement, during a plating process, a plating solution is supplied into the plating tank 200 from the bottom of the plating tank 200, and overflowing plating solution is recovered by the plating solution storage tank 302 through the plating solution recovery groove 260. Thus, the plating solution can be circulated. A plating solution return pipe 312, for returning the plating solution to the plating solution storage tank 302, is connected to one of ports of the three-way valve 306. Thus, the plating solution can be circulated even in a standby condition of plating, and a plating solution circulating system is constructed. As described above, the plating solution in the plating solution storage tank 302 is always circulated through the plating solution circulating system, and hence a lowering rate of a concentration of the plating solution can be reduced and a number of the substrates W, which can be processed, can be increased, compared with a case in which the plating solution is simply stored.

Particularly, in this embodiment, by controlling the plating solution supply pump 304, a flow rate of the plating solution, which is circulated during a standby of plating or during a plating process, can be set individually. Specifically, an amount of circulating plating solution during the standby of plating is in the range of 2 to 20 liters/minute, for example, and an amount of circulating plating solution during the plating process is in the range of 0 to 10 liters/minute, for example. With this arrangement, a large amount of circulating plating solution during the standby of plating can be ensured to keep a temperature of a plating bath in a cell constant, and the flow rate of the circulating plating solution is made smaller during the plating process to form a protective film (plated film) having a more uniform thickness.

The thermometer 266, provided in the vicinity of the bottom of the plating tank 200, measures a temperature of the plating solution introduced into the plating tank 200, and controls a heater 316 and a flow meter 318 to be described below.

Specifically, in this embodiment, there are provided a heating device 322 for heating the plating solution indirectly by a heat exchanger 320 which is provided in the plating solution in the plating solution storage tank 302 and uses water as a heating medium which has been heated by a separate heater 316 and has passed through the flow meter 318, and a stirring pump 324 for mixing the plating solution by circulating the plating solution in the plating solution storage tank 302. This is because during plating, in some cases, the plating solution is used at a high temperature (about 80° C.), and this structure should cope with such cases. This method can prevent very delicate plating solution from being mixed with foreign matter or the like unlike an in-line heating method.

Figure 23:
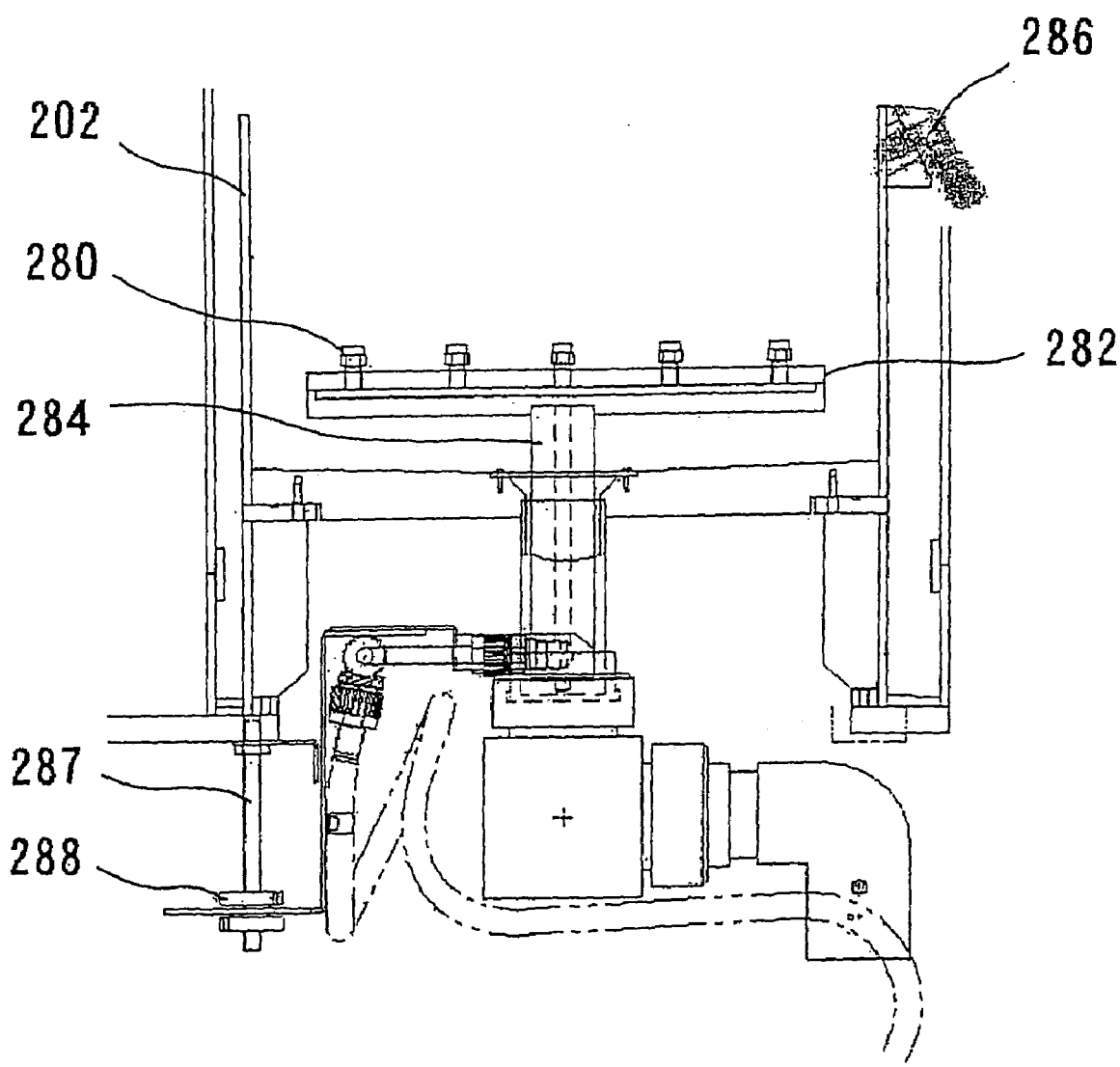
FIG. 23 is a cross-sectional view of a cleaning tank in the pretreatment apparatus shown in FIG. 2.

FIG. 23 shows details of a cleaning tank 202 provided beside the plating tank 200. At a bottom of the cleaning tank 202, there is provided a nozzle plate 282 having a plurality of jet nozzles 280, attached thereto, for upwardly jetting a rinsing liquid such as pure water. The nozzle plate 282 is coupled to an upper end of a nozzle lifting shaft 284. The nozzle lifting shaft 284 can be moved vertically by changing a position of engagement between a nozzle position adjustment screw 287 and a nut 288 engaging the screw 287 so as to optimize a distance between the jet nozzles 280 and a substrate W located above the jet nozzles 280.

Further, on an outer surface of a peripheral wall of the cleaning tank 202 and at a position above the jet nozzles 280, there is provided a head cleaning nozzle 286 for jetting a cleaning liquid, such as pure water, inwardly and slightly downwardly onto at least a portion, which was in contact with the plating solution, of the head portion 232 of the substrate head 204.

In operating the cleaning tank 202, the substrate W held in the head portion 232 of the substrate head 204 is located at a predetermined position in the cleaning tank 202. A cleaning liquid (rinsing liquid), such as pure water, is jetted from the jet nozzles 280 to clean (rinse) the substrate W, and at the same time, a cleaning liquid, such as pure water, is jetted from the head cleaning nozzle 286 to clean at least a portion, which was in contact with the plating solution, of the head portion 232 of the substrate head 204, thereby preventing a deposit from accumulating on that portion which was immersed in the plating solution.

According to this electroless plating apparatus 30, when the substrate head 204 is in a raised position, the substrate W is held by vacuum attraction in the head portion 232 of the substrate head 204, as described above, while the plating solution in the plating tank 200 is allowed to circulate.

When plating is performed, the plating tank cover 270 of the plating tank 200 is opened, and the substrate head 204 is lowered, while the substrate head 204 is rotating, so that the substrate W held in the head portion 232 is immersed in the plating solution in the plating tank 200.

After immersing the substrate W in the plating solution for a predetermined time, the substrate head 204 is raised to lift the substrate W from the plating solution in the plating tank 200 and, as needed, pure water (stop liquid) is immediately jetted from the jet nozzle 268 toward the substrate W to cool the substrate W, as described above. The substrate head 204 is further raised to lift the substrate W to a position above the plating tank 200, and rotation of the substrate head 204 is stopped.

Next, while the substrate W is held by vacuum attraction in the head portion 232 of the substrate head 204, the substrate head 204 is moved to a position right above the cleaning tank 202. While rotating the substrate head 204, the substrate head 204 is lowered to a predetermined position in the cleaning tank 202. A cleaning liquid (rinsing liquid), such as pure water, is jetted from the jet nozzles 280 to clean (rinse) the substrate W, and at the same time, a cleaning liquid, such as pure water, is jetted from the head cleaning nozzle 286 to clean at least a portion, which was in contact with the plating solution, of the head portion 232 of the substrate head 204.

After completion of cleaning of the substrate W, rotation of the substrate head 204 is stopped, and the substrate head 204 is raised to lift the substrate W to a position above the cleaning tank 202. Further, the substrate head 204 is moved to a transfer position between the transfer robot 16 and the substrate head 204, and the substrate W is transferred to the transfer robot 16, and is transported to a next process by the transfer robot 16.

As shown in FIG. 24, the electroless plating apparatus 30 is provided with a plating solution management unit 330 for measuring an amount of the plating solution held by the electroless plating apparatus 30 and for analyzing composition of the plating solution by an absorptiometric method, a titration method, or an electrochemical measurement, or the like, and replenishing components which are insufficient in the plating solution. In the plating solution management unit 330, signals indicative of analysis results are processed to replenish insufficient components from a replenishment tank (not shown) to the plating solution storage tank 302 using a metering pump, thereby controlling an amount of the plating solution and composition of the plating solution. Thus, thin film plating can be realized with good reproducibility.

The plating solution management unit 330 has a dissolved oxygen densitometer 332 for measuring dissolved oxygen in the plating solution held by the electroless plating apparatus 30 by an electrochemical method, for example. According to the plating solution management unit 330, dissolved oxygen concentration in the plating solution can be controlled at a constant value on the basis of indication of the dissolved oxygen densitometer 332 by deaeration, nitrogen blowing, or other methods. In this manner, the dissolved oxygen concentration in the plating solution can be controlled at a constant value, and a plating reaction can be achieved with good reproducibility.

When the plating solution is used repeatedly, certain components are accumulated by being carried in from the outside or decomposition of the plating solution, resulting in lowering of reproducibility of plating and deteriorating of film quality. By adding a mechanism for removing such specific components selectively, life of the plating solution can be prolonged and reproducibility can be improved.

Figure 25:
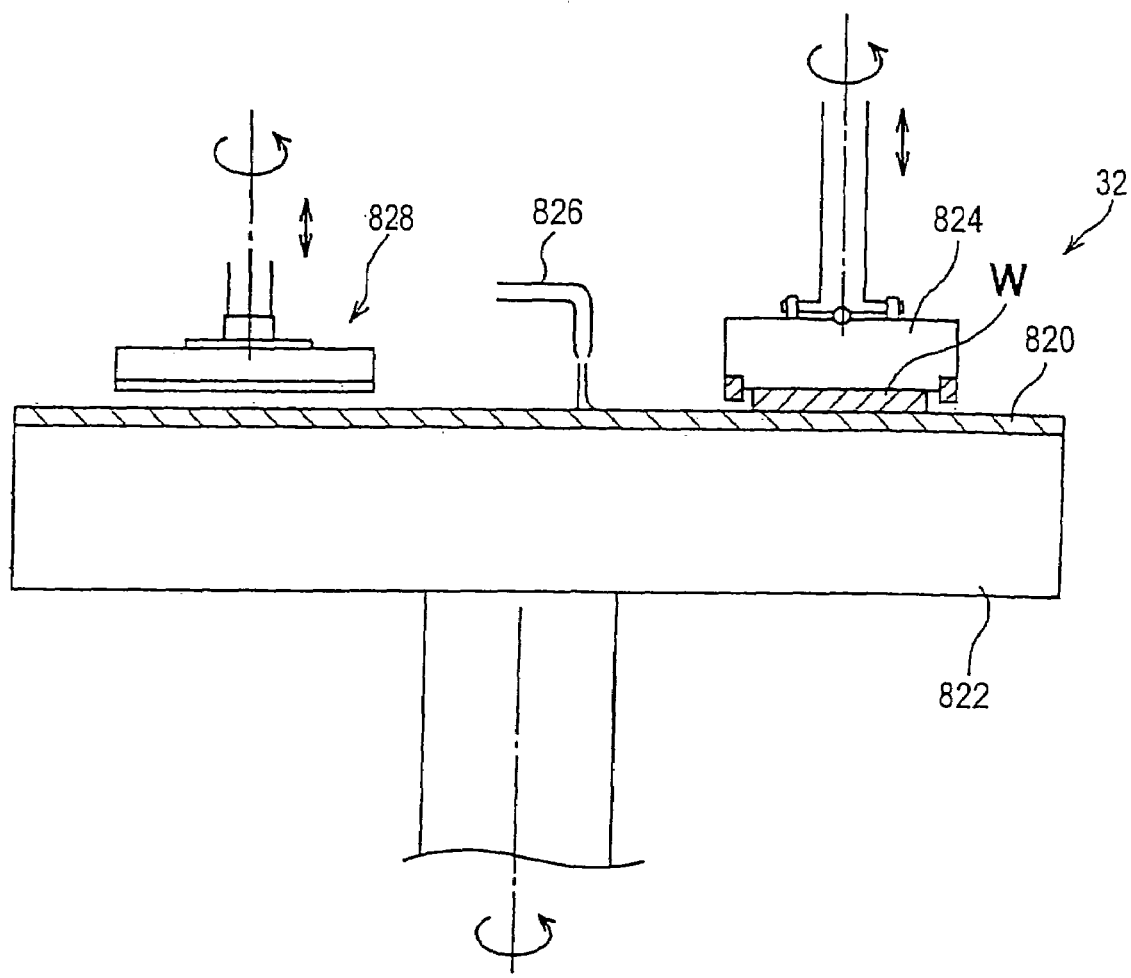
FIG. 25 is a schematic view showing an example of a polishing apparatus shown in FIG. 2.

FIG. 25 shows an example of a polishing apparatus (CMP apparatus) 32. The polishing apparatus 32 comprises a polishing table 822 having a polishing surface composed of a polishing cloth (polishing pad) 820 that is attached to an upper surface of the polishing table 822, and a top ring 824 for holding a substrate W with its to-be-polished surface facing the polishing table 822. In the polishing apparatus 32, a surface of the substrate W is polished by rotating the polishing table 822 and the top ring 824 about their own axes, respectively, and supplying a polishing liquid from a polishing liquid nozzle 826 provided above the polishing table 822 while pressing the substrate W against the polishing cloth 820 of the polishing table 822 at a given pressure by the top ring 824. It is possible to use a fixed abrasive type of pad containing fixed abrasive particles as the polishing pad.

Polishing power of the polishing surface of the polishing cloth 820 decreases with a continuation of a polishing operation of the CMP apparatus. In order to restore polishing power of the polishing surface of the polishing cloth 820, a dresser 828 is provided to conduct dressing of the polishing cloth 820, for example, at a time of replacing the substrate W. During this dressing, while rotating the dresser 828 and the polishing table 822 respectively, a dressing surface (dressing member) of the dresser 828 is pressed against the polishing cloth 820 of the polishing table 822, thereby removing polishing liquid and chips adhering to the polishing surface and, at the same time, flattening and dressing the polishing surface, whereby the polishing surface is regenerated. The polishing table 822 may be provided with a monitor for monitoring a surface state of a substrate to detect in situ an end point of polishing, or with a monitor for inspecting in situ a finish state of the substrate.

Figure 26:
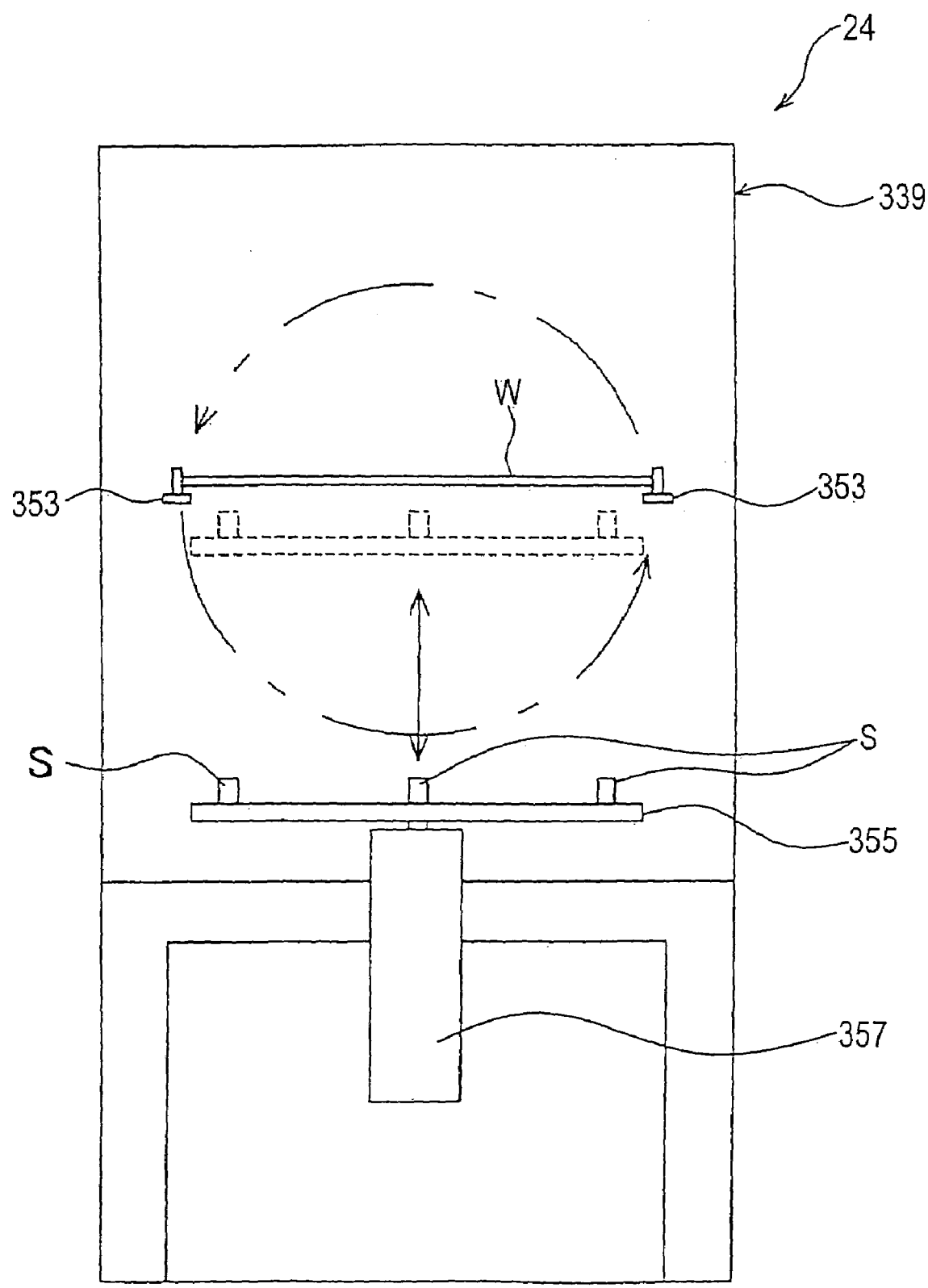
FIG. 26 is a schematic front view of neighborhood of a reversing machine in a film thickness measuring instrument shown in FIG. 2.
Figure 27:
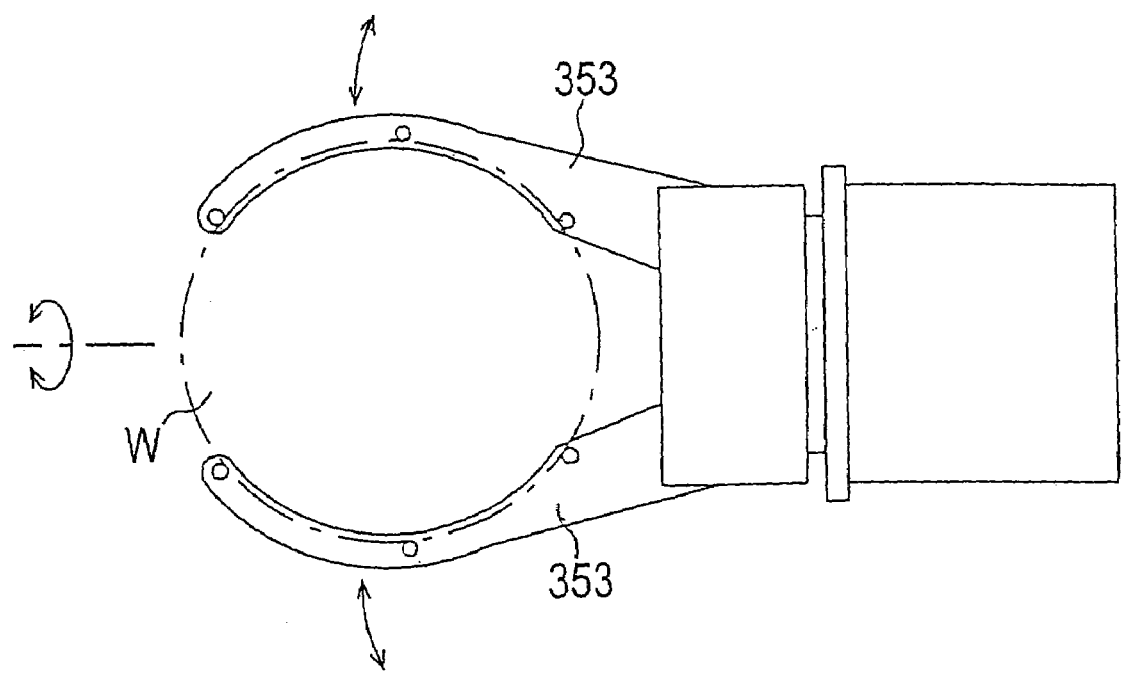
FIG. 27 is a plan view of a reversing arm section of the reversing machine in the film thickness measuring instrument shown in FIG. 2.

FIGS. 26 and 27 show the film thickness measuring instrument 24 provided with a reversing machine. As shown in FIGS. 26 and 27, the film thickness measuring instrument 24 is provided with a reversing machine 339. The reversing machine 339 includes reversing arms 353, 353. The reversing arms 353, 353 put a substrate W therebetween and hold its outer periphery from right and left sides, and rotate the substrate W through 180°, thereby turning the substrate over. A circular mounting base 355 is disposed immediately below the reversing arms 353, 353 (reversing stage), and a plurality of film thickness sensors S are provided on the mounting base 355. The mounting base 355 is adapted to be movable vertically by a drive mechanism 357.

During reversing of the substrate W, the mounting base 355 waits at a position, indicated by solid lines, below the substrate W. Before or after reversing, the mounting base 355 is raised to a position indicated by dotted lines to bring the film thickness sensors S close to the substrate W gripped by the reversing arms 353, 353, thereby measuring a film thickness.

According to this embodiment, since there is no restriction such as arms of a transfer robot, the film thickness sensors S can be installed at arbitrary positions on the mounting base 355. Further, the mounting base 355 is adapted to be movable upward and downward, so that a distance between the substrate W and the sensors S can be adjusted at a time of measurement. It is also possible to mount plural types of sensors suitable for a purpose of detection, and change a distance between the substrate W and the sensors each time measurements are made by respective sensors. However, the mounting base 355 moves upward and downward, thus requiring certain measuring time.

An eddy current sensor, for example, may be used as film thickness sensor S. The eddy current sensor measures a film thickness by generating an eddy current and detecting a frequency or loss of current that has returned through the substrate W, and is used in a non-contact manner. An optical sensor may also be suitable for the film thickness sensor S. The optical sensor irradiates a light onto a sample, and measures a film thickness directly based on information of reflected light. The optical sensor can measure a film thickness not only for a metal film but also for an insulating film such as an oxide film. Places for setting the film thickness sensors S are not limited to those shown in the drawings, and the sensors may be set at any desired places for measurement in any desired numbers.

Figure 28:
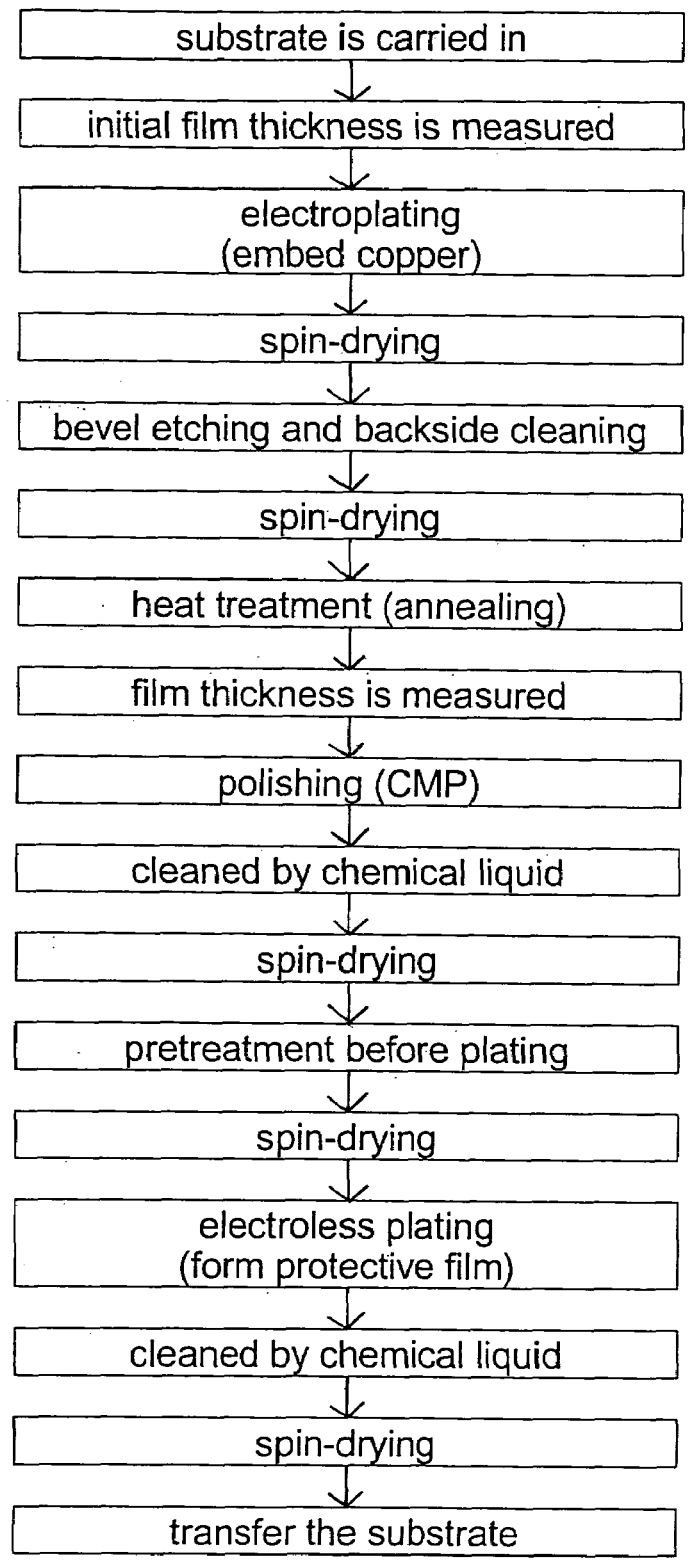
FIG. 28 is a flow chart in a substrate processing apparatus shown in FIG. 2.

Next, a sequence of processing for forming copper interconnects on the substrate having the seed layer 6 formed thereon, as shown in FIG. 1A, which is performed by the substrate processing apparatus having the above structure will be described with reference to FIG. 28.

First, substrate W having the seed layer 6 formed in its surface, as shown in FIG. 1A, is taken out one by one from a transfer box 10, and is carried in the loading/unloading station 14. The substrate W, which has been carried into the loading/unloading station 14, is transferred to the thickness measuring instrument 24 by the transfer robot 16, and an initial film thickness (film thickness of the seed layer 6) is measured by the thickness measuring instrument 24. Thereafter, if necessary, the substrate is inverted and transferred to the plating apparatus 18. In the plating apparatus 18, as shown in FIG. 1B, the copper layer 7 is deposited onto the surface of the substrate W to embed copper.

Then, the substrate W having the copper layer 7 formed thereon is transferred to the cleaning and drying apparatus 20 by the transfer robot 16, and the substrate W is cleaned with pure water and spin-dried. Alternatively, in a case where a spin-drying function is provided in the plating apparatus 18, the substrate W is spin-dried (removal of liquid) in the plating apparatus 18. This dried substrate is then transferred to the bevel etching and backside cleaning apparatus 22.

In the bevel etching and backside cleaning apparatus 22, unnecessary copper attached to a bevel (edge) portion of the substrate W is removed by etching, and at the same time, the backside surface of the substrate is cleaned with pure water or the like. Thereafter, as described above, the substrate W is transferred to the cleaning and drying apparatus 20 by the transfer robot 16, and the substrate W is cleaned with pure water and spin-dried. Alternatively, in a case where a spin-drying function is provided in the bevel etching and backside cleaning apparatus 22, the substrate W is spin-dried in the bevel etching and backside cleaning apparatus 22. This dried substrate is then transferred to the heat treatment apparatus 26 by the transfer robot 16.

In the heat treatment apparatus 26, heat treatment (annealing) of the substrate W is performed. Then, the substrate W after the heat treatment is transferred to the film thickness measuring instrument 24 by the transfer robot 16, and a film thickness of copper is measured by the film thickness measuring instrument 24. The film thickness of the copper layer 7 (see FIG. 1B) is obtained from a difference between this measured result and a measured result of the above initial film thickness. Then, for example, plating time of a subsequent substrate is adjusted according to this measured film thickness. If the film thickness of the copper layer 7 is insufficient, then additional formation of the copper layer is performed by plating again. Then, the substrate W after film thickness measurement is transferred to the polishing apparatus 32 by the transfer robot 16.

As shown in FIG. 1C, unnecessary copper layer 7 and the seed layer 6 deposited on the surface of the substrate W are polished and removed by the polishing apparatus 32 to flatten the surface of the substrate W. At this time, for example, a film thickness or a finishing state of the substrate is inspected by a monitor, and when an end point is detected by the monitor, polishing is finished. Then, the substrate W, which has been polished, is transferred to the cleaning and drying apparatus 20 by the transfer robot 16, and a surface of the substrate is cleaned with a chemical liquid and then cleaned (rinsed) with pure water, and then spin-dried by rotating the substrate at a high speed in the cleaning and drying apparatus 20. After this spin-drying, the substrate W is transferred to the pretreatment apparatus 28 by the transfer robot 16.

In the pretreatment apparatus 28, a pretreatment before plating, comprising at least one of attachment of Pd catalyst to the surface of the substrate and removal of oxide film attached to an exposed surface of the substrate, for example, is performed. Then, the substrate after this pretreatment, as described above, is transferred to the cleaning and drying apparatus 20 by the transfer robot 16, and the substrate W is cleaned with pure water and spin-dried. Alternatively, in a case where a spin-drying function is provided in the pretreatment apparatus 28, the substrate W is spin-dried (removal of liquid) in the pretreatment apparatus 28. This dried substrate is then transferred to the electroless plating apparatus 30 by the transfer robot 16.

In the electroless plating apparatus 30, as shown in FIG. 1D, for example, electroless CoWP plating is performed on surfaces of exposed interconnects 8 to form a protective film (plated film) 9 composed of CoWP alloy selectively on the exposed surfaces of the interconnects 8, thereby protecting the interconnects 8. A thickness of the protective film 9 is in the range of 0.1 to 500 nm, preferably in the range of 1 to 200 nm, more preferably in the range of 10 to 100 nm. At this time, for example, the thickness of the protective film 9 is monitored, and when this film thickness reaches a predetermined value, i.e., an end point is detected, the electroless plating is finished.

After the electroless plating, the substrate W is transferred to the cleaning and drying apparatus 20 by the transfer robot 16, and a surface of the substrate is cleaned with a chemical liquid, and cleaned (rinsed) with pure water, and then spin-dried by rotating the substrate at a high speed in the cleaning and drying apparatus 20. After this spin-drying, the substrate W is returned into the transfer box 10 via the loading/unloading station 14 by the transfer robot 16.

In this embodiment, copper is used as an interconnect material. However, copper alloy, silver, silver alloy, or the like may be used as the interconnect material.

According to the present invention, a plating solution comprising a high-concentration sulfuric acid bath, for example, is used as a plating bath that is brought into contact with a conductive layer and actually used in a plating process, thereby increasing embeddability of a plated film. At the same time, an anode solution comprising a low-concentration sulfuric acid bath, for example, is used as a plating bath that is brought into contact with an anode but not actually used in a plating process, thereby lowering electric conductivity of the plating bath as a whole for increasing in-plane uniformity of a thickness of a plated film.

What is claimed is:

1. A method of plating a film onto a substrate, comprising:
   positioning an electric resistor between a conductive layer, formed on at least a portion of a surface of a substrate, and an anode;
   introducing respectively a plating solution into a space between said conductive layer and said anode on a conductive layer side of said space, and an anode solution into said space between said conductive layer and said anode on an anode side of said space, thereby filling said space with a plating bath composed of said plating solution and said anode solution, with said plating solution containing 25 to 75 g/L of copper ions and at least 0.4 mole/L of an organic acid or an inorganic acid, and said anode solution being of the same composition as said plating solution, or containing 0 to 75 g/L of copper ions and at most 0.6 mole/L of an organic acid or an inorganic acid;
   applying a voltage between said conductive layer and said anode to plate a surface of said conductive layer;
   measuring electric conductivity of said anode solution; and
   adding at least pure water, an organic acid, or an inorganic acid to said anode solution to keep the electric conductivity of said anode solution at a constant level of at most 200 mS/cm when said surface of said conductive layer starts being plated.

2. The method according to claim 1, wherein
   each of said plating solution and said anode solution comprises a solution containing sulfuric acid, alkane sulfonic acid, or alkanol sulfonic acid.

3. The method according to claim 1, wherein
   a source of copper ions of each of said plating solution and said anode solution comprises at least one copper compound selected from the group consisting of copper sulfate, copper oxide, copper chloride, copper carbonate, copper pyrophosphate, copper alkane sulfonic acid, copper alkanol sulfonic acid, and copper organic acid.

4. The method according to claim 1, wherein
   each of said plating solution and said anode solution comprises a solution including sulfuric acid and copper sulfate and containing at most 58 g/L of copper ions.

5. A method of plating a film onto a substrate, comprising:
   positioning an electric resistor between a conductive layer, formed on at least a portion of a surface of a substrate, and an anode;
   introducing respectively a plating solution into a space between said conductive layer and said anode on a conductive layer side of said space, and an anode solution into said space between said conductive layer and said anode on an anode side of said space, thereby filling said space with a plating bath composed of said plating solution and said anode solution, with said plating solution containing 25 to 75 g/L of copper ions and at least 0.4 mole/L of an organic acid or an inorganic acid, and said anode solution being of the same composition as said plating solution, or containing 0 to 75 g/L of copper ions and at most 0.6 mole/L of an organic acid or an inorganic acid;
   applying a voltage between said conductive layer and said anode to plate a surface of said conductive layer; and
   managing said anode solution by using electric conductivity thereof.

6. The method according to claim 5, wherein
   each of said plating solution and said anode solution comprises a solution containing sulfuric acid, alkane sulfonic acid, or alkanol sulfonic acid.

7. The method according to claim 5, wherein
   a source of copper ions of each of said plating solution and said anode solution comprises at least one copper compound selected from the group consisting of copper sulfate, copper oxide, copper chloride, copper carbonate, copper pyrophosphate, copper alkane sulfonic acid, copper alkanol sulfonic acid, and copper organic acid.

8. The method according to claim 5, wherein
   each of said plating solution and said anode solution comprises a solution including sulfuric acid and copper sulfate and containing at most 58 g/L of copper ions.

9. A method of plating a film onto a substrate, comprising:
   positioning an electric resistor between a conductive layer, formed on at least a portion of a surface of a substrate, and an anode;
   introducing respectively a plating solution into a space between said conductive layer and said anode on a conductive layer side of said space, and an anode solution into said space between said conductive layer and said anode on an anode side of said space, thereby filling said space with a plating bath composed of said plating solution and said anode solution, with said plating solution containing 25 to 75 g/L of copper ions and at least 0.4 mole/L of an organic acid or an inorganic acid, and said anode solution being of the same composition as said plating solution, or containing 0 to 75 g/L of copper ions and at most 0.6 mole/L of an organic acid or an inorganic acid; and
   applying a voltage between said conductive layer and said anode to plate a surface of said conductive layer,
   wherein said plating solution and said anode solution are separated from each other by an ion exchanger.

10. The method according to claim 9, wherein
    each of said plating solution and said anode solution comprises a solution containing sulfuric acid, alkane sulfonic acid, or alkanol sulfonic acid.

11. The method according to claim 9, wherein
    a source of copper ions of each of said plating solution and said anode solution comprises at least one copper compound selected from the group consisting of copper sulfate, copper oxide, copper chloride, copper carbonate, copper pyrophosphate, copper alkane sulfonic acid, copper alkanol sulfonic acid, and copper organic acid.

12. The method according to claim 9, wherein
    each of said plating solution and said anode solution comprises a solution including sulfuric acid and copper sulfate and containing at most 58 g/L of copper ions.

* * * * *